United States Patent
Kim et al.

(10) Patent No.: US 9,741,780 B2
(45) Date of Patent: Aug. 22, 2017

(54) ORGANIC LIGHT-EMITTING DIODE DISPLAY

(71) Applicant: Samsung Display Co., Ltd., Yongin-si, Gyeonggi-do (KR)

(72) Inventors: Deok Hoi Kim, Seongnam-si (KR); Gun Woo Ko, Seoul (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 0 days.

(21) Appl. No.: 15/190,100

(22) Filed: Jun. 22, 2016

(65) Prior Publication Data

US 2017/0005156 A1    Jan. 5, 2017

(30) Foreign Application Priority Data

Jul. 3, 2015 (KR) .......................... 10-2015-0095347

(51) Int. Cl.
*H01L 27/32* (2006.01)
*G09G 3/32* (2016.01)
(Continued)

(52) U.S. Cl.
CPC ....... *H01L 27/3262* (2013.01); *G09G 3/3233* (2013.01); *H01L 27/3265* (2013.01); *G09G 3/3258* (2013.01); *G09G 3/3275* (2013.01); *G09G 2300/0426* (2013.01); *G09G 2300/0861* (2013.01); *G09G 2310/0251* (2013.01);
(Continued)

(58) Field of Classification Search
CPC .......... H01L 27/3262; H01L 27/3265; G09G 3/3233
See application file for complete search history.

(56) References Cited

U.S. PATENT DOCUMENTS

| 6,417,521 | B2 * | 7/2002 | Inukai ........................ G06F 1/10 257/13 |
| 7,057,588 | B2 * | 6/2006 | Asano .................. G09G 3/3233 345/76 |

(Continued)

FOREIGN PATENT DOCUMENTS

| KR | 10-2008-0043050 A | 5/2008 |
| KR | 10-2010-0012353 A | 2/2010 |

(Continued)

*Primary Examiner* — Ida M Soward
(74) *Attorney, Agent, or Firm* — Knobbe Martens Olson & Bear LLP

(57) ABSTRACT

An organic light-emitting diode (OLED) display is disclosed. In one aspect, the display includes a substrate including a display area configured to display an image and the display area includes first and second regions. A plurality of OLEDs are formed in the display area and separated from one another, and a plurality of pixel circuits are formed in the display area and include first and second pixel circuits respectively formed in the first and second regions. First and second contact holes are respectively formed in the first and second pixel circuits, each pixel circuit including thin film transistors (TFTs) including first and second TFTs and electrically connected to the OLEDs. Each pixel circuit includes a node line configured to electrically connect the first TFT to the second TFT through the first and second contact holes, and the first contact hole of is different from the second contact hole.

20 Claims, 15 Drawing Sheets

(51) Int. Cl.
*G09G 3/3233* (2016.01)
*G09G 3/3258* (2016.01)
*G09G 3/3275* (2016.01)

(52) U.S. Cl.
CPC ............... *G09G 2310/0262* (2013.01); *G09G 2320/0626* (2013.01)

(56) References Cited

U.S. PATENT DOCUMENTS

| | | | |
|---|---|---|---|
| 2009/0206727 A1* | 8/2009 | Kim | B82Y 10/00 |
| | | | 313/500 |
| 2016/0260842 A1* | 9/2016 | Yamazaki | H01L 21/0273 |
| 2016/0336386 A1* | 11/2016 | Saito | H01L 23/53238 |
| 2017/0068140 A1* | 3/2017 | Hayashi | H01L 27/124 |

FOREIGN PATENT DOCUMENTS

| KR | 10-2013-0027845 A | 3/2013 |
|---|---|---|
| KR | 10-2014-0102561 A | 8/2014 |

\* cited by examiner

FIG. 7

| SPLIT | NO.1 | NO.2 | NO.3 | NO.4 | NO.5 | NO.6 |
|---|---|---|---|---|---|---|
| Position of CNT Hole | | | | | | |
| Size of CNT Hole | CNT hole size : 1.8 / 2.0 / 2.2 / 2.4 / 2.6 um | | | | | |

ORGANIC LIGHT-EMITTING DIODE DISPLAY

INCORPORATION BY REFERENCE TO ANY PRIORITY APPLICATIONS

This application claims priority to and the benefit of Korean Patent Application No. 10-2015-0095347 filed in the Korean Intellectual Property Office on Jul. 3, 2015, the entire contents of which are incorporated herein by reference.

BACKGROUND

Field

The described technology generally relates to an organic light-emitting diode display.

Description of the Related Technology

Examples of flat panel displays include organic light-emitting diode (OLED) displays, liquid crystal displays, plasma display panels, and the like.

Among those, OLED displays include thin film transistors and OLEDs formed on a substrate.

In a typical OLED display, thin film transistors are manufactured over the substrate via MEMS technology such as a photolithography process.

The above information disclosed in this Background section is only for enhancement of understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to an OLED display that can suppress the difference among current values supplied to a plurality of OLEDs from occurring over a substrate even though the difference among widths of active layers of a plurality of thin film transistors unexpectedly occurs over the substrate.

Another aspect is an OLED display that includes: a substrate including a display area displaying an image; a plurality of organic light emitting elements formed on the display area of the substrate and separated from each other; and a plurality of pixel circuits formed on the display area of the substrate and including a plurality of thin film transistors respectively connected to the plurality of organic light emitting elements and a node line connecting any one and another among the plurality of thin film transistors through a contact hole, wherein a contact hole of a first pixel circuit formed in a first region of the display area among the plurality of pixel circuits is different from a contact hole of a second pixel circuit formed in a second region of the display area.

The substrate can further include a non-display area adjacent to the display area, and the second region of the display area can be closer to the non-display area compared to the first region.

The contact hole of the second pixel circuit can have a larger area compared to the contact hole of the first pixel circuit.

The second pixel circuit can further include at least one additional contact hole adjacent to the contact hole.

The node line of the second pixel circuit can connect any one and another among the plurality of thin film transistors through the additional contact hole.

The plurality of thin film transistors can include a driving thin film transistor connected to the organic light emitting element, and at least one switching thin film transistor connected to the driving thin film transistor.

The contact hole of the second pixel circuit can overlap an active pattern of the driving thin film transistor.

The contact hole of the first pixel circuit can not overlap the active pattern of the driving thin film transistor.

The contact hole of the first pixel circuit can overlap the active pattern of the driving thin film transistor, and the contact hole of the second pixel circuit can overlap the active pattern of the driving thin film transistor with the wider area compared to the contact hole of the first pixel circuit.

The OLED display can further include a data line extending in one direction on the substrate and connected to the plurality of thin film transistors, and the plurality of thin film transistors can include: a first thin film transistor formed on the substrate and including a first active pattern connected to the organic light emitting element and a first gate electrode formed on the first active pattern and contacting the node line through the contact hole; a second thin film transistor connected to one end of the first active pattern and including a second active pattern connected to the data line and a second gate electrode formed on the second active pattern; and a third thin film transistor connected to the other end of the first active pattern and including a third active pattern connected to the first gate electrode through the node line and a third gate electrode formed on the third active pattern.

The node line can be formed with the same layer as the data line.

The OLED display can further include: a first scan line formed on the second active pattern to cross the second active pattern and the third active pattern and connected to the second gate electrode and the third gate electrode; and a driving power source line adjacent to the data line on the first scan line to cross the first scan line and connected to the first active pattern.

The OLED display can further include a capacitor electrode connected to the driving power source line on the first gate electrode and overlapping the first gate electrode to form a capacitor along with the first gate electrode.

The capacitor electrode can further include an opening communicating with the contact hole.

The plurality of thin film transistors can further include a fourth thin film transistor connected to the third active pattern and including a fourth active pattern connected to the first gate electrode though the node line and a fourth gate electrode formed on the fourth active pattern, and a second scan line formed on the fourth active pattern to cross the fourth active pattern and connected to the fourth gate electrode, and an initialization power source line connected to the fourth active pattern can further included.

The plurality of thin film transistors can further include: a fifth thin film transistor including a fifth active pattern connecting the first active pattern and the driving power source line and a fifth gate electrode formed on the fifth active pattern; and a sixth thin film transistor including a sixth active pattern connecting the first active pattern and the organic light emitting element and a sixth gate electrode formed on the sixth active pattern, and a light emission control line formed on the fifth active pattern and the sixth active pattern to respectively cross the fifth active pattern and the sixth active pattern and respectively connected to the fifth gate electrode and the sixth gate electrode can further included.

The plurality of thin film transistors can further include a seventh thin film transistor including a seventh active pattern connected to the fourth active pattern and a seventh gate electrode formed on the seventh active pattern, and a third scan line formed on the seventh active pattern to cross the seventh active pattern and connected to the seventh gate electrode can further included.

Another aspect is an OLED display that includes: a substrate including a display area displaying an image; a plurality of organic light emitting elements formed on the display area of the substrate and separated from each other; and a plurality of pixel circuits formed on the display area of the substrate and including a plurality of thin film transistors respectively connected to the plurality of organic light emitting elements and a node line connecting any one and the other among the plurality of thin film transistors through a contact hole, wherein a contact hole of the first pixel circuit formed in the first region of the display area among the plurality of pixel circuits has a larger area compared to the contact hole of the second pixel circuit formed in the second region of the display area.

Another aspect is an OLED display that includes: a substrate including a display area displaying an image; a plurality of organic light emitting elements formed on the display area of the substrate and separated from each other; and a plurality of pixel circuits formed on the display area of the substrate and including a plurality of thin film transistors respectively connected to the plurality of organic light emitting elements and a node line connecting any one and another among the plurality of thin film transistors through a contact hole, wherein the contact hole of the first pixel circuit formed in the first region of the display area among the plurality of pixel circuits is present in a larger number compared to the contact hole of the second pixel circuit formed in the second region of the display area.

Another aspect is an OLED display that includes: a substrate including a display area displaying an image; a plurality of organic light emitting elements formed on the display area of the substrate and separated from each other; and a plurality of pixel circuits formed on the display area of the substrate and including a plurality of thin film transistors respectively connected to the plurality of organic light emitting elements and a node line connecting any one and another among the plurality of thin film transistors through a contact hole, wherein the contact hole of the first pixel circuit formed in the first region of the display area among the plurality of pixel circuits overlaps the active pattern of any one thin film transistor with the wider area compared to the contact hole of the second pixel circuit formed in the second region of the display area.

Another aspect is an organic light-emitting diode (OLED) display, comprising: a substrate including a display area configured to display an image, wherein the display area includes first and second regions; a plurality of OLEDs formed in the display area and separated from one another; and a plurality of pixel circuits formed in the display area and including a first pixel circuit in the first region and a second pixel circuit in the second region, wherein first and second contact holes are respectively formed in the first and second pixel circuits, wherein each pixel circuit includes i) a plurality of thin film transistors (TFTs) including first and second TFTs and electrically connected to the OLEDs and ii) a node line configured to electrically connect the first TFT to the second TFT through the first and second contact holes, wherein the first contact hole of is different from the second contact hole.

In the above OLED display, the substrate further includes a non-display area surrounding the display area, wherein the second region of the display area is closer to the non-display area than the first region.

In the above OLED display, the second contact hole is greater in area than the first contact hole.

In the above OLED display, the second pixel circuit further includes a third contact hole located adjacent to the second contact hole.

In the above OLED display, the TFTs include third and fourth TFTs, wherein the node line of the second pixel circuit is further configured to electrically connect the third TFT to the fourth TFT through the third contact hole.

In the above OLED display, TFTs include: a driving TFT electrically connected to the OLED; and at least one switching TFT electrically connected to the driving TFT.

In the above OLED display, the second contact hole overlaps an active pattern of the driving TFT in the depth dimension of the OLED display.

In the above OLED display, the first contact hole does not overlap the active pattern of the driving TFT in the depth dimension of the OLED display.

In the above OLED display, the first contact hole overlaps the active pattern of the driving TFT in the depth dimension of the OLED display, wherein the second contact hole overlaps the active pattern of the driving TFT and has an area wider than an area of the first contact hole.

The above OLED display further comprises a data line formed over the substrate and extending in one direction, wherein the data line is electrically connected to the TFTs, wherein the TFTs include: the first TFT formed over the substrate and including i) a first active pattern electrically connected to the OLED and ii) a first gate electrode formed on the first active pattern and electrically connected to the node line through the first contact hole; the second TFT electrically connected to a first end of the first active pattern and including i) a second active pattern connected to the data line and ii) a second gate electrode formed on the second active pattern; and a third TFT electrically connected to a second end of the first active pattern and including i) a third active pattern connected to the first gate electrode through the node line and ii) a third gate electrode formed on the third active pattern.

In the above OLED display, the node line is formed on the same layer as the data line.

The above OLED display further comprises: a first scan line formed on the second active pattern and crossing the second and third active patterns, wherein the first scan line is electrically connected to the second and third gate electrodes; and a driving power source line formed adjacent to the data line and crossing the first scan line, wherein the driving power source line is electrically connected to the first active pattern.

The above OLED display further comprises a capacitor electrode electrically connected to the driving power source line and overlapping the first gate electrode in the depth dimension of the OLED display to form a capacitor along with the first gate electrode.

In the above OLED display, the capacitor electrode further includes an opening connected to the contact hole.

In the above OLED display, the TFTs further include a fourth TFT connected to the third active pattern and including i) a fourth active pattern electrically connected to the first gate electrode through the node line and ii) a fourth gate electrode formed on the fourth active pattern, wherein the OLED display further comprises: a second scan line formed on the fourth active pattern and crossing the fourth active pattern, wherein the second scan line is electrically connected to the fourth gate electrode; and an initialization power source line electrically connected to the fourth active pattern.

In the above OLED display, the TFTs further include: a fifth TFT including i) a fifth active pattern configured to electrically connect the first active pattern to the driving power source line and ii) a fifth gate electrode formed on the fifth active pattern; and a sixth TFT including i) a sixth active pattern configured to electrically connect the first active pattern to the OLED and ii) a sixth gate electrode formed on the sixth active pattern, wherein the OLED display further comprises a light emission control line formed on the fifth and sixth active patterns and crossing the fifth and sixth active patterns, wherein the light emission control line is electrically connected to the fifth and sixth gate electrodes.

In the above OLED display, the TFTs further include a seventh TFT including i) a seventh active pattern electrically connected to the fourth active pattern and ii) a seventh gate electrode formed on the seventh active pattern, wherein the OLED display further comprises a third scan line formed on the seventh active pattern and crossing the seventh active pattern, wherein the third scan line is electrically connected to the seventh gate electrode.

Another aspect is an organic light-emitting diode (OLED) display, comprising: a substrate including a display area configured to display an image, wherein the display area includes first and second regions; a plurality of OLEDs formed in the display area and separated from one another; and a plurality of pixel circuits formed in the display area, each pixel circuit including a first pixel circuit in the first region and a second pixel circuit in the second region, wherein first and second contact holes are respectively formed in the first and second pixel circuits, wherein each pixel circuit includes i) a plurality of thin film transistors (TFTs) including first and second TFTs and electrically connected to the OLEDs and ii) a node line configured to electrically connect the first TFT to the second TFT through the first and second contact holes, wherein the second contact hole is greater in area than the first contact hole.

Another aspect is an organic light-emitting diode (OLED) display, comprising: a substrate including a display area configured to display an image, wherein the display area includes first and second regions; a plurality of OLEDs formed in the display area and separated from one another; and a plurality of pixel circuits formed in the display area and including a first pixel circuit in the first region and a second pixel circuit in the second region, wherein each pixel circuit includes i) a plurality of TFTs including first and second TFTs and electrically connected to the OLEDs and ii) a node line configured to electrically connect the first TFT to the second TFT through one or more contact holes, wherein the number of contact holes of the first pixel circuit is greater than the number of contact holes of the second pixel circuit.

Another aspect is an organic light-emitting diode (OLED) display, comprising: a substrate including a display area configured to display an image, wherein the display area includes first and second regions; a plurality of OLEDs formed in the display area and separated from one another; and a plurality of pixel circuits formed in the display area and including a first pixel circuit in the first region and a second pixel circuit in the second region, wherein first and second contact holes are respectively formed in the first and second pixel circuits, wherein each pixel circuit includes i) a plurality of TFTs including first and second TFTs and electrically connected to the OLEDs and ii) a node line configured to electrically connect the first TFT to the second TFT through the first and second contact holes, wherein the first contact hole overlaps an active pattern of one of the TFTs is greater in area than the second contact hole.

In the above OLED display, the contact hole of the second pixel circuit is located in a channel region of the active pattern of the one TFT.

Another aspect is an organic light-emitting diode (OLED) display, comprising: a substrate including a display area configured to display an image, wherein the display area includes first and second regions; a plurality of OLEDs formed in the display area and separated from one another; and a plurality of pixel circuits formed in the display area and including a first pixel circuit in the first region and a second pixel circuit in the second region, wherein first and second contact holes are respectively formed in the first and second pixel circuits, wherein each pixel circuit includes i) a plurality of TFTs including first and second TFTs and electrically connected to the OLEDs and ii) a node line configured to electrically connect the first TFT to the second TFT through the first and second contact holes, wherein the first contact hole partially overlaps an active pattern of one of the TFTs in the first pixel circuit, and wherein the second contact hole entirely overlaps an active pattern of one of the TFTs in the second pixel circuit.

According to at least one of the disclosed embodiments, when a difference is undesirably generated in the width of each active pattern of the plurality of thin film transistors throughout the entire substrate, an OLED display can suppress the difference of the current respectively supplied to the plurality of organic light emitting elements throughout the substrate.

BRIEF DESCRIPTION OF THE DRAWINGS

FIG. 7 is a view respectively showing a plurality of thin film transistors having different conditions in another experimental example.

DETAILED DESCRIPTION OF CERTAIN INVENTIVE EMBODIMENTS

Figure 1:
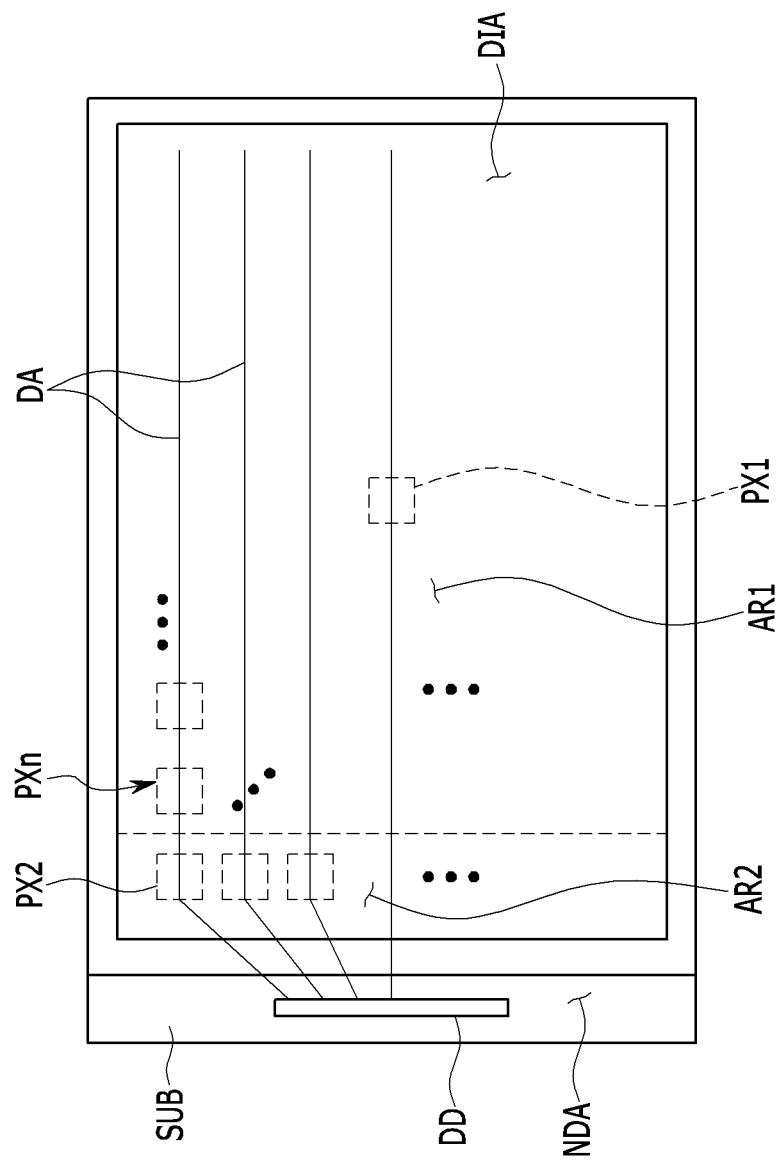
FIG. 1 is a plan view schematically illustrating an OLED display according to an exemplary embodiment.

In the following detailed description, only certain exemplary embodiments have been shown and described, simply by way of illustration. As those skilled in the art would realize, the described embodiments can be modified in various different ways, all without departing from the spirit or scope of the described technology.

Accordingly, the drawings and description are to be regarded as illustrative in nature and not restrictive, and like reference numerals designate like elements throughout the specification.

Further, in exemplary embodiments, since like reference numerals designate like elements having the same configuration, a first exemplary embodiment is representatively described, and in other exemplary embodiments, only a configuration different from the first exemplary embodiment will be described.

In addition, the size and thickness of each configuration shown in the drawings are arbitrarily shown for understanding and ease of description, but the described technology is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements can also be present.

In addition, unless explicitly described to the contrary, the word "comprise" and variations such as "comprises" or "comprising" will be understood to imply the inclusion of stated elements but not the exclusion of any other elements. Further, in the specification, the word "on" means positioning on or below the object portion, and does not essentially mean positioning on the upper side of the object portion based on a gravity direction. In this disclosure, the term "substantially" includes the meanings of completely, almost completely or to any significant degree under some applications and in accordance with those skilled in the art. The term "connected" can include an electrical connection.

Hereinafter, an OLED display according to an exemplary embodiment will be described with reference to FIG. 1 to FIG. 5.

FIG. 1 is a plan view schematically illustrating an OLED display according to an exemplary embodiment. Hereinafter, a pixel can mean a minimum unit displaying an image.

As illustrated in FIG. 1, an OLED display according to an exemplary embodiment includes a substrate SUB, a plurality of pixels PXn, a plurality of data lines DA, and data drivers DD.

The substrate SUB includes a display area DIA displaying an image and a non-display area NDA which is adjacent to the display area DIA. The non-display area NDA can be formed to enclose an edge of the display area DIA. The substrate SUB is an insulating substrate formed of glass, polymer, stainless steel, or the like. The substrate SUB can be flexible, stretchable, foldable, bendable, or rollable. The substrate SUB is flexible, stretchable, foldable, bendable, or rollable, such that the entire OLED display can be flexible, stretchable, foldable, bendable, or rollable.

The pixels PXn are formed on the substrate SUB, corresponding to the display area DIA of the substrate SUB. The pixels PXn respectively include a pixel circuit including an OLED which is connected to the data lines Das and emits light at luminance corresponding to a driving current corresponding to data signals supplied from the data lines Das, and a plurality of thin film transistors and at least one capacitor which control the driving current flowing in the OLED. The pixels PXn each include the OLED, such that a plurality of pixel circuits including a plurality of OLEDs and a plurality of thin film transistors connected to the OLEDs, respectively, are formed on the display area DIA of the substrate SUB.

For convenience of explanation, although not illustrated in FIG. 1, the pixels PXn can each be connected to a plurality of scan lines, respectively, which are connected to a gate driver supplying different scan signals, and can be further connected to a driving power source line and an initialization power source line which supply a voltage. Further, a second electrode which is a cathode of the OLED included in each of the plurality pixels PXn, respectively, can be connected to a common power source. A detailed structure of each of the pixels will be described below. The foregoing gate driver, scan lines, driving power source line, and initialization power source line will be described below, but are not limited thereto, and therefore can be connected to the pixels PXn, respectively, in known various forms.

The pixels PXn include a first pixel PX1 which is formed in a first region AR1 of the display area DIA of the substrate and a second pixel PX2 which is formed in a second region AR2 of the display area DIA.

Here, the second region AR2 of the display area DIA of the substrate SUB can be a region closer to the non-display area NDA compared to the first region AR1, however it is not limited thereto, and the first region AR1 and the second region AR2 can respectively correspond to any regions that are different regions within the display area DIA of the substrate SUB.

The data lines DA each extend in one direction on the substrate SUB to be connected to the pixels PXn, respectively.

The data driver DD is formed on the non-display area NDA of the substrate SUB and is connected to the data lines DA. The data driver DD supplies data signals to the data lines DAs, respectively, corresponding to control signals supplied from external devices, such as a timing controller. The data signal supplied from the data driver DD to the data line DA is supplied to one pixel PXn selected by the scan signal whenever the scan signal is supplied from the scan line to the one selected pixel PXn. Next, one pixel PXn is charged with a voltage corresponding to the data signal and emits light at luminance corresponding thereto.

Next, a circuit of one pixel PXn of the OLED display according to the exemplary embodiment will be described in more detail with reference to FIG. 2.

Figure 2:
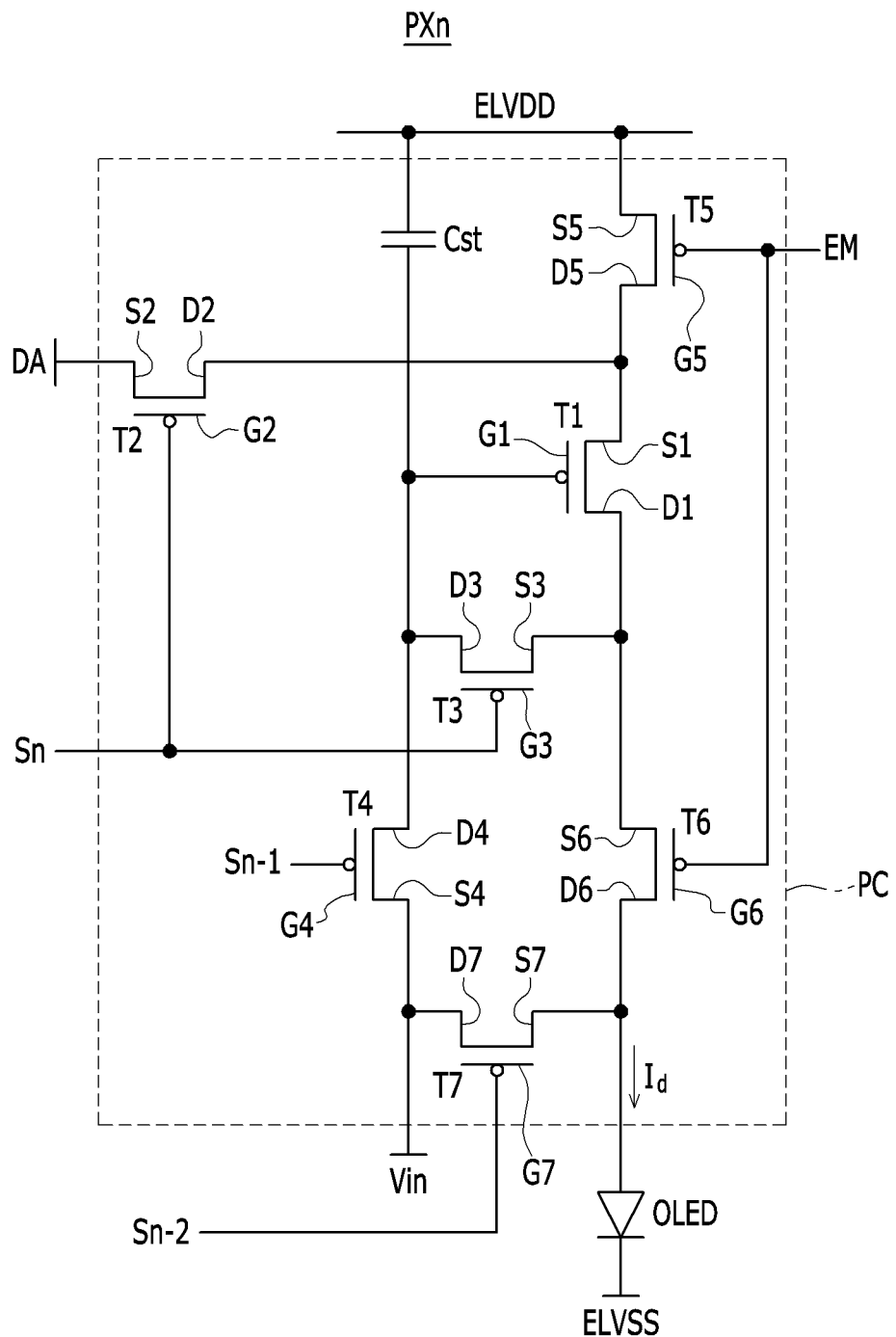
FIG. 2 is a circuit diagram illustrating a pixel of the OLED display according to an exemplary embodiment illustrated in FIG. 1.

FIG. 2 is a circuit diagram illustrating a pixel of an OLED display according to an exemplary embodiment illustrated in FIG. 1.

As shown in FIG. 2, one pixel PXn of the OLED display according to an exemplary embodiment includes a pixel circuit PC including a plurality of thin film transistors T1, T2, T3, T4, T5, T6, and T7 and a capacitor Cst, plurality of wires Sn, Sn-1, Sn-2, EM, Vin, DA, and ELVDD which are selectively connected to the thin film transistors T1, T2, T3, T4, T5, T6, and T7, and an OLED.

The thin film transistors T1, T2, T3, T4, T5, T6, and T7 include a first thin film transistor T1, a second thin film transistor T2, a third thin film transistor T3, a fourth thin film transistor T4, a fifth thin film transistor T5, a sixth thin film transistor T6, and a seventh thin film transistor T7.

A first gate electrode G1 of the first thin film transistor T1 is connected to a third drain electrode D3 and the third thin film transistor T3 and a fourth drain electrode D4 of the fourth thin film transistor T4, respectively, a first source electrode S1 is connected to a second drain electrode D2 of the second thin film transistor T2 and a fifth drain electrode D5 of the fifth thin film transistor T5, and a first drain electrode D1 is connected to a third source electrode S3 of the third thin film transistor T3 and a sixth source electrode S6 of the sixth thin film transistor T6, respectively.

A second gate electrode G2 of the second thin film transistor T2 is connected to a first scan line Sn, the second source electrode S2 is connected to a data line DA, and the second drain electrode D2 is connected to the first source electrode S1 of the first thin film transistor T1.

A third gate electrode G3 of the third thin film transistor T3 is connected to the first scan line Sn, the third source electrode S3 is connected to the first drain electrode D1 of the first thin film transistor T1, and the third drain electrode D3 is connected to the first gate electrode G1 of the first thin film transistor T1.

A fourth gate electrode G4 of a fourth thin film transistor T4 is connected to a second scan line Sn-1, a fourth source electrode S4 is connected to an initialization power source line Vin, and the fourth drain electrode D4 is connected to the first gate electrode G1 of the first thin film transistor T1.

A fifth gate electrode G5 of a fifth thin film transistor T5 is connected to an emission control line EM, the source electrode S5 is connected to a driving power source line ELVDD, and the fifth drain electrode D5 is connected to the first source electrode S1 of the first thin film transistor T1.

A sixth gate electrode G6 of a sixth thin film transistor T6 is connected to the emission control line EM and a sixth source electrode S6 is connected to the first drain electrode D1 of the first thin film transistor T1.

A seventh gate electrode G7 of a seventh thin film transistor T7 is connected to a third scan line Sn-2, a seventh source electrode S7 is connected to the OLED, and a seventh drain electrode D7 is connected to the fourth source electrode S4 of the fourth thin film transistor T4.

The foregoing scan lines include the first scan line Sn which transfers first scan signals to the second gate electrode G2 and the third gate electrode G3 of the second thin film transistor T2 and the third thin film transistor T3, respectively, the second scan line Sn-1 which transfers a second scan signal to the fourth gate electrode G4 of the fourth thin film transistor T4, the third scan line Sn-2 which transfers a third scan signal to a seventh gate electrode G7 of the seventh thin film transistor T7, and an emission control line EM which transfers emission control signals to the fifth gate electrode G5 and the sixth gate electrode G6 of the fifth thin film transistor T5 and the sixth thin film transistor T6, respectively.

The capacitor Cst includes one electrode which is connected to the driving power source line ELVDD and the other electrode which is connected to the first gate electrode G1 and a third drain electrode D3 of the third thin film transistor T3.

The OLED includes a first electrode, a second electrode formed on the first electrode, and an organic emission layer formed between the first electrode and the second electrode. The first electrode of the OLED is connected to the seventh source electrode S7 of the seventh thin film transistor T7 and the sixth drain electrode D6 of the sixth thin film transistor T6, respectively, and the second electrode is connected to a common power source ELVSS to which the common signal is transferred.

As an example of driving of one pixel PXn including the pixel circuit PC, the wires Sn, Sn-1, Sn-2, EM, Vin, DA, and ELVDD, and the OLED, first, when the third scan signal is transferred to the third scan line Sn-2 to turn on the seventh thin film transistor T7, a residual current flowing in the first electrode of the OLED exits to the fourth thin film transistor T4 through the seventh thin film transistor T7, such that the OLED suppresses light from being unexpectedly emitted due to the residual current flowing in the first electrode of the OLED.

Next, when the second scan signal is transferred to the second scan line Sn-1 and the initialization signal is transferred to the initialization power source line Vin, the fourth thin film transistor T4 is turned on and thus an initialization voltage by the initialization signal is supplied to the first gate electrode G1 of the first thin film transistor T1 and the other electrode of the capacitor Cst through the fourth thin film transistor T4, such that the first gate electrode G1 and the capacitor Cst are initialized. In this case, the first thin film transistor T1 is turned on while the first gate electrode G1 is initialized.

Next, when the first scan signal is transferred to the first scan line Sn and the data signal is transferred to the data line DA, the second thin film transistor T2 and the third thin film transistor T3 are each turned on to supply a data voltage Vd by the data signal to the first gate electrode G1 through the second thin film transistor T2, the first thin film transistor T1, and the third thin film transistor T3. In this case, as the voltage supplied to the first gate electrode G1, a compensation voltage {Vd+Vth, Vth is a negative (−) value} which is reduced as much as the threshold voltage Vth of the first thin film transistor T1 from the data voltage Vd supplied from the first data line DA is supplied. The compensation voltage (Vd+Vth) supplied to the first gate electrode G1 is supplied to the other electrode of the capacitor Cst which is connected to the first gate electrode G1.

Next, a driving voltage Ve1 by the driving signal is supplied from the driving power source line ELVDD to one electrode of the capacitor Cst and the foregoing compensation voltage (Vd+Vth) is supplied to the other electrode thereof, and thus the capacitor Cst is stored with a charge corresponding to a difference in the voltage applied to both electrodes, such that the first thin film transistor T1 is turned on for a predetermined time.

Next, when the emission control signal is applied to the emission control line EM, the fifth thin film transistor T5 and the sixth thin film transistor T6 are each turned on and thus the driving voltage Ve1 by the driving signal from the driving power source line ELVDD is supplied to the first thin film transistor T1 through the fifth thin film transistor T5.

Then, a driving current Id which corresponds to a difference between the voltage supplied to the first gate electrode G1 and the driving voltage Ve1 by the capacitor Cst flows in the first drain electrode D1 of the first thin film transistor T1 while the driving voltage Ve1 passes through the first thin film transistor T1 which is turned on by the capacitor Cst and the driving current Id is supplied to the OLED through the sixth thin film transistor T6, such that the OLED emits light for a predetermined time.

Meanwhile, the pixel circuit of the OLED display according to the exemplary embodiment is configured to include the first thin film transistor T1 to the seventh thin film transistor T7, the capacitor Cst, the first scan line Sn to the third scan line Sn-2, the data line DA, the driving power source line ELVDD, and the initialization power source line Vin, but is not limited thereto, and a pixel circuit of an OLED display according to another exemplary embodiment can be configured to include a plurality of thin film transistors, at least one capacitor, and wires including at least one scan line and at least one driving power source line.

Hereinafter, among the pixels PXn of the OLED display according to the exemplary embodiment described with reference to FIGS. 3 to 5, arrangements of the first pixel PX1 which is formed in the first region AR1 of the display area DIA of the substrate SUB and a second pixel PX2 which is located in the second region AR2 of the display area DIA, respectively, will be described.

Insulating layers are formed between components which are formed on different layers to be described below, in which the insulating layer can be an inorganic insulating layer or an organic insulating layer which is made of a silicon nitride, a silicon oxide, or the like. Further, these insulating layers can be formed in a single layer or plural layers.

Figure 3:
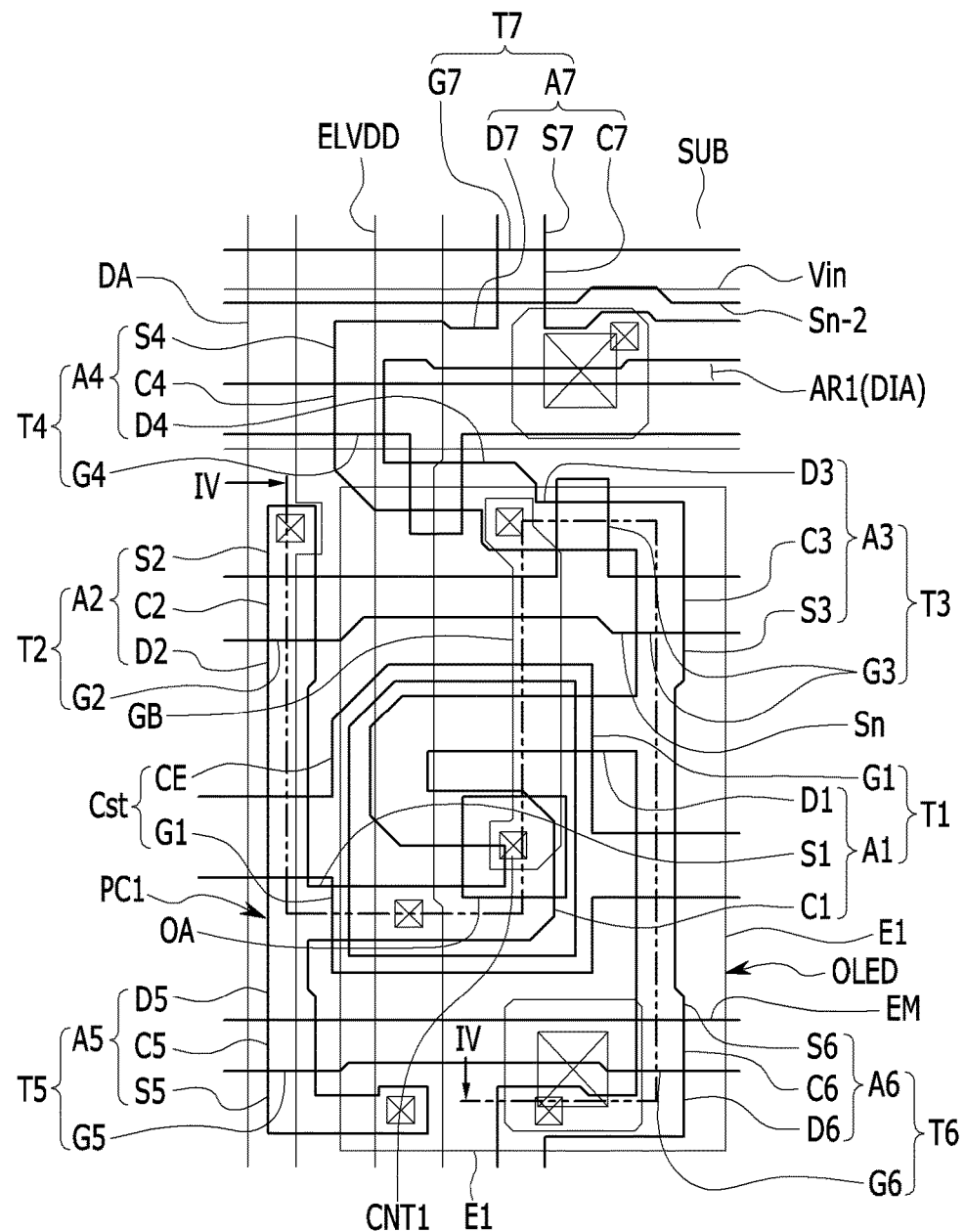
FIG. 3 is a layout view illustrating a first pixel of the OLED display according to an exemplary embodiment illustrated in FIG. 1.

FIG. 3 is a layout view illustrating a first pixel of an OLED display according to an exemplary embodiment illustrated in FIG. 1. FIG. 4 is a cross-sectional view taken along the line IV-IV of FIG. 3.

Figure 4:
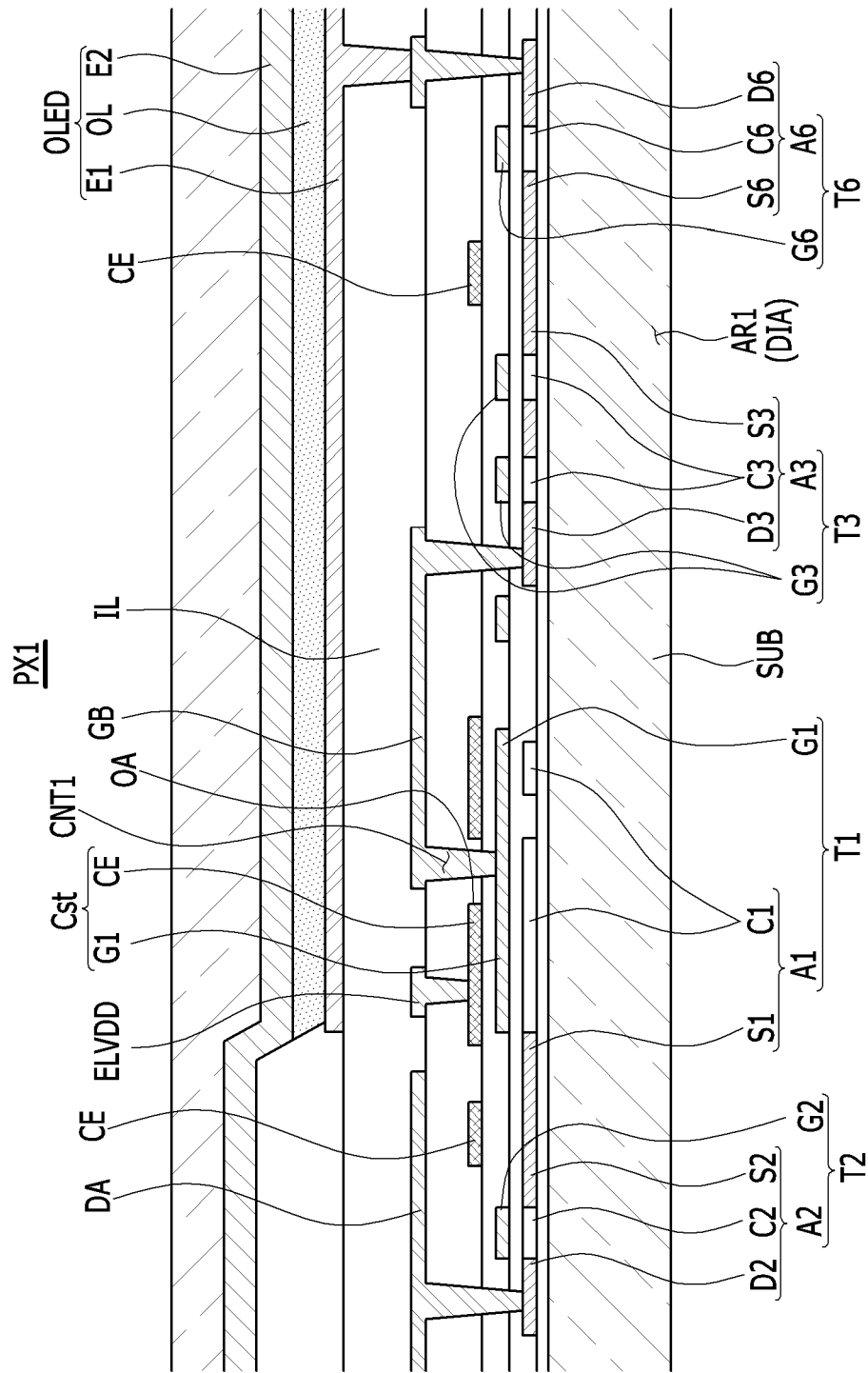
FIG. 4 is a cross-sectional view taken along the line IV-IV of FIG. 3.

As illustrated in FIGS. 3 and 4, the first pixel PX1 which is located in the first region AR1 of the display area DIA of the substrate SUB includes the first thin film transistor T1, the second thin film transistor T2, the third thin film transistor T3, the fourth thin film transistor T4, the fifth thin film transistor T5, the sixth thin film transistor T6, the seventh thin film transistor T7, the first scan line Sn, the second scan line Sn-1, the third scan line Sn-2, the emission control line EM, the capacitor Cst, the data line DA, the driving power source line ELVDD, a node line GB, the initialization power source line Vin, and the OLED. In this case, as the thin film transistors of the first pixel PX1, the first thin film transistor T1, the second thin film transistor T2, the third thin film transistor T3, the fourth thin film transistor T4, the fifth thin film transistor T5, the sixth thin film transistor T6, the seventh thin film transistor T7, the node line GB, and the capacitor Cst form the first pixel circuit PC1 connected to the OLED. That is, the first pixel circuit PC1 is formed in the first region AR1 of the display area DIA.

Among the thin film transistors included in the first pixel circuit PC1, the first thin film transistor T1 is connected to the OLED to function as a driving thin film transistor, and the second thin film transistor T2, the third thin film transistor T3, the fourth thin film transistor T4, the fifth thin film transistor T5, the sixth thin film transistor T6, and the seventh thin film transistor T7 can function as switching thin film transistors connected to the first thin film transistor T1.

The first thin film transistor T1 is formed on the substrate SUB and includes a first active pattern A1 and the first gate electrode G1.

The first active pattern A1 includes a first source electrode S1, a first channel C1, and a first drain electrode D1. The first source electrode S1 is respectively connected to the second drain electrode D2 of the second thin film transistor T2 and the fifth drain electrode D5 of the fifth thin film transistor T5, and the first drain electrode D1 is respectively connected to the third source electrode S3 of the third thin film transistor T3 and the sixth source electrode S6 of the sixth thin film transistor T6. The first channel C1 which is a channel region of the first active pattern A1 overlapping the first gate electrode G1 is bent at least once and extends within a space overlapping the first gate electrode G1 which is a limited space and thus the length of the first channel C1 can be formed to be long, such that a driving range of a gate voltage applied to the first gate electrode G1 can be formed to be wide. As a result, a magnitude of the gate voltage applied to the first gate electrode G1 is changed within the wide driving range to more delicately control a gray of light emitted from the OLED, thereby improving quality of an image which is displayed from the OLED display. A shape of the first active pattern A1 can be variously changed in various forms such as 'inverse S', 'S', 'M', and 'W'.

The first active pattern A1 can be made of polysilicon or an oxide semiconductor. The oxide semiconductor can be formed of any one of an oxide of titanium (Ti), hafnium (Hf), zirconium (Zr), aluminum (Al), tantalum (Ta), germanium (Ge), zinc (Zn), gallium (Ga), tin (Sn), or indium (In), and zinc oxide (ZnO), indium-gallium-zinc oxide (InGaZnO4), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O), which are composite oxides thereof. In the case in which the first active pattern A1 is made of the oxide semiconductor, a separate protecting layer can be added in order to protect the oxide semiconductor vulnerable to an external environment such as exposure to a high temperature or the like.

The first channel C1 of the first active pattern A1 can be channel-doped with N-type impurities or P-type impurities, and the first source electrode S1 and the first drain electrode D1 are spaced apart from each other having the first channel C1 therebetween and can each be doped with doping impurities having an opposite type to the doping impurities doped in the first channel C1.

The first gate electrode G1 is formed on the first channel C1 of the first active pattern A1 and has an island shape. The first gate electrode G1 is connected to the fourth drain electrode D4 of the fourth thin film transistor T4 and the third drain electrode D3 of the third thin film transistor T3 by a node line GB through a first contact hole CNT1. The first gate electrode G1 contacts the node line GB through the first contact hole CNT1 overlapping the first active pattern A1. The first gate electrode G1 overlaps the capacitor electrode CE and can function as the gate electrode of the first thin film transistor T1 and the other electrode of the capacitor Cst at the same time. That is, the first gate electrode G1 forms the capacitor Cst along with the capacitor electrode CE.

The second thin film transistor T2 is formed on the substrate SUB, and includes a second active pattern A2 and a second gate electrode G2. The second active pattern A2 includes a second source electrode S2, a second channel C2, and a second drain electrode D2. The second source electrode S2 is connected to the data line DA through the contact hole, and the second drain electrode D2 is connected to the first source electrode S1 of the first thin film transistor T1. The second channel C2 which is a channel region of the second active pattern A2 overlapping the second gate electrode G2 is formed between the second source electrode S2 and the second drain electrode D2. That is, the second active pattern A2 is connected to the first active pattern A1.

The second channel C2 of the second active layer A2 can be channel-doped with N-type impurities or P-type impurities. The second source electrode S2 and the second drain electrode D2 are spaced apart from each other having the first channel C1 therebetween and can each be doped with doping impurities having an opposite type to the doping impurities doped in the first channel C1. The second active layer A2 is formed on the same layer as the first active layer A1, is made of the same material as the first active layer A1, and is integrally formed with the first active layer A1.

The second gate electrode G2 is formed on the second channel C2 of the second active layer A2 and integrally formed with the first scan line Sn.

The third thin film transistor T3 is formed on the substrate SUB and includes the third active layer A3 and the third gate electrode G3.

The third active layer A3 includes the third source electrode S3, the third channel C3, and the third drain electrode D3. The third source electrode S3 is connected to the first drain electrode D1, and the third drain electrode D3 is connected to the first gate electrode G1 of the first thin film transistor T1 by the node line GB through the first contact hole CNT1. The third channel C3 which is a channel region of the third active pattern A3 overlapping the third gate electrode G3 is formed between the third source electrode S3 and the third drain electrode D3. That is, the third active pattern A3 connects the first active pattern A1 to the first gate electrode G1.

The third channel C3 of the third active pattern A3 can be channel-doped with N-type impurities or P-type impurities, and the third source electrode S3 and the third drain electrode D3 are spaced apart from each other having the third channel C3 therebetween and can each be doped with doping impurities having an opposite type to the doping impurities doped in the third channel C3. The third active pattern A3 is formed on the same layer as the first active pattern A1 and the second active pattern A2, is made of the same material as the first active pattern A1 and the second active pattern A2, and is integrally formed with the first active pattern A1 and the second active pattern A2.

The third gate electrode G3 is formed on the third channel C3 of the third active pattern A3 and integrally formed with the first scan line Sn. The third gate electrode G3 is formed as a dual gate electrode, however it is not limited thereto, and it can be formed of a single gate electrode.

The fourth thin film transistor T4 is formed on the substrate (SUB) and includes a fourth active pattern A4 and the fourth gate electrode G4.

The fourth active pattern A4 includes the fourth source electrode S4, the fourth channel C4, and the fourth drain electrode D4. The fourth source electrode S4 is connected to the initialization power source line Vin through the contact hole, and the fourth drain electrode D4 is connected to the first gate electrode G1 of the first thin film transistor Ti by the node line GB through the first contact hole CNT1. The fourth channel C4 which is a channel region of the fourth active pattern A4 overlapping the fourth gate electrode G4 is formed between the fourth source electrode S4 and the fourth drain electrode D4. That is, the fourth active pattern A4 is connected to the third active pattern A3 and the first gate electrode G1, respectively, substantially simultaneously while connecting the initialization power line Vin to the first gate electrode G1.

The fourth channel C4 of the fourth active pattern A4 can be channel-doped with N-type impurities or P-type impurities, and the fourth source electrode S4 and the fourth drain electrode D4 are spaced apart from each other having the fourth channel C4 therebetween and can each be doped with doping impurities having an opposite type to the doping impurities doped in the fourth channel C4. The fourth active pattern A4 is formed on the same layer as the first active pattern A1, the second active pattern A2, and the third active pattern A3, is made of the same material as the first active pattern A1, the second active pattern A2, and the third active pattern A3, and is integrally formed with the first active pattern A1, the second active pattern A2, and the third active pattern A3.

The fourth gate electrode G4 is formed on the fourth channel C4 of the fourth active pattern A4 and integrally formed with the second scan line Sn-1. The fourth gate electrode G4 is formed as a dual gate electrode, however it is not limited thereto, and it can be formed of the single gate electrode.

The fifth thin film transistor T5 is formed on the substrate (SUB), and includes a fifth active pattern A5 and the fifth gate electrode G5.

The fifth active pattern A5 includes the fifth source electrode S5, the fifth channel C5, and the fifth drain electrode D5. The fifth source electrode S5 is connected to the driving power source line ELVDD through the contact hole, and the fifth drain electrode D5 is connected to the first source electrode S1 of the first thin film transistor T1. The fifth channel G5 which is a channel region of the fifth active pattern A5 overlapping the fifth gate electrode G5 is formed between the fifth source electrode S5 and the fifth drain electrode D5. That is, the fifth active pattern A5 connects the driving power source line ELVDD to the first active pattern A1.

The fifth channel C5 of the fifth active pattern A5 can be channel-doped with N-type impurities or P-type impurities, and the fifth source electrode S5 and the fifth drain electrode D5 are spaced apart from each other having the fifth channel C5 therebetween and can each be doped with doping impurities having an opposite type to the doping impurities doped in the fifth channel C5. The fifth active pattern A5 is formed on the same layer as the first active pattern A1, the second active pattern A2, the third active pattern A3, and the fourth active pattern A4, is made of the same material as the first active pattern A1, the second active pattern A2, the third active pattern A3, and the fourth active pattern A4, and is integrally formed with the first active pattern A1, the second active pattern A2, the third active pattern A3, and the fourth active pattern A4.

The fifth gate electrode G5 is formed on the fifth channel C5 of the fifth active pattern A5 and integrally formed with the emission control line EM.

The sixth thin film transistor T6 is formed on the substrate SUB, and includes the sixth active pattern A6 and the sixth gate electrode G6.

The sixth active pattern A6 includes the sixth source electrode S6, the sixth channel C6, and the sixth drain electrode D6. The sixth source electrode S6 is connected to the first drain electrode D1 of the first thin film transistor T1, and the sixth drain electrode D6 is connected to the first electrode E1 of the OLED through the contact hole. The sixth channel C6 which is a channel region of the sixth active pattern A6 overlapping the sixth gate electrode G6 is formed between the sixth source electrode S6 and the sixth drain electrode D6. That is, the sixth active pattern A6 connects between the first active pattern A1 and the first electrode E1 of the OLED.

The sixth channel C6 of the sixth active pattern A6 can be channel-doped with N-type impurities or P-type impurities, and the sixth source electrode S6 and the sixth drain electrode D6 are spaced apart from each other having the sixth channel C6 therebetween and can each be doped with doping impurities having an opposite type to the doping impurities doped in the sixth channel C6. The sixth active pattern A6 is formed on the same layer as the first active pattern A1, the second active pattern A2, the third active pattern A3, the fourth active pattern A4, and the fifth active pattern A5, is made of the same material as the first active pattern A1, the second active pattern A2, the third active pattern A3, the fourth active pattern A4, and the fifth active pattern A5, and is integrally formed with the first active pattern A1, the second active pattern A2, the third active pattern A3, the fourth active pattern A4, and the fifth active pattern A5.

The sixth gate electrode G6 is formed on the sixth channel C6 of the sixth active pattern A6 and is integrally formed with the emission control line EM.

The seventh thin film transistor T7 is formed on the substrate (SUB), and includes the seventh active pattern A7 and the seventh gate electrode G7.

The seventh active pattern A7 includes the seventh source electrode S7, the seventh channel C7, and the seventh drain electrode D7. The seventh source electrode S7 is connected to the first electrode of the OLED of another pixel (pixel formed over the pixel of FIG. 3) which is not illustrated in FIG. 2, and the seventh drain electrode D7 is connected to the fourth source electrode S4 of the fourth thin film transistor T4. The seventh channel C7 which is a channel region of the seventh active pattern A7 overlapping the seventh gate electrode G7 is formed between the seventh source electrode S7 and the seventh drain electrode D7. That is, the seventh active pattern A7 connects the first electrode to the fourth active pattern A4 of the OLED.

The seventh channel C7 of the seventh active pattern A7 can be channel-doped with N-type impurities or P-type impurities, and the seventh source electrode S7 and the seventh drain electrode D7 are spaced apart from each other having the seventh channel C7 therebetween and can each be doped with doping impurities having an opposite type to the doping impurities doped in the seventh channel C7. The seventh active pattern A7 is formed on the same layer as the first active pattern A1, the second active pattern A2, the third active pattern A3, the fourth active pattern A4, the fifth active pattern A5, and the sixth active pattern A6, is formed of the same material as the first active pattern A1, the second active pattern A2, the third active pattern A3, the fourth active pattern A4, the fifth active pattern A5, and the sixth active pattern A6, and is integrally formed with the first active pattern A1, the second active pattern A2, the third active pattern A3, the fourth active pattern A4, the fifth active pattern A5, and the sixth active pattern A6.

The seventh gate electrode G7 is formed on the seventh channel C7 of the seventh active pattern A7 and integrally formed with the third scan line Sn-2.

A plurality of insulating layers are sequentially laminated on the first active pattern A1, the second active pattern A2, the third active pattern A3, the fourth active pattern A4, the fifth active pattern A5, the sixth active pattern A6, and the seventh active pattern A7. The insulating layers can be the inorganic insulating layer such as a silicon nitride or a silicon oxide, or the organic insulating layer. Also, the insulating layers can be formed of the single layer or the multilayer.

The first scan line Sn is formed on the second active pattern A2 and the third active pattern A3 to extend in one direction crossing the second active pattern A2 and the third active pattern A3, and is connected to the second gate electrode G2 and the third gate electrode G3, being integrally formed with the second gate electrode G2 and the third gate electrode G3.

The second scan line Sn-1 is formed on the fourth active pattern A4, being spaced apart from the first scan line Sn, and extends in one direction crossing the fourth active pattern A4 and is connected to the fourth gate electrode G4, being integrally formed with the fourth gate electrode G4.

The third scan line Sn-2 is formed on the seventh active pattern A7, being spaced apart from the second scan line Sn-1, and extends in one direction crossing the seventh active pattern A7 and is connected to the seventh gate electrode G7, being integrally formed with the seventh gate electrode G7.

The light emitting control line EM is formed on the fifth active pattern A5 and the sixth active pattern A6, being spaced apart from the first scan line Sn, and extends in one direction crossing the fifth active pattern A5 and the sixth active pattern A6 and is connected to the fifth gate electrode G5 and the sixth gate electrode G6, being integrally formed with the fifth gate electrode G5 and the sixth gate electrode G6.

As described above, the light emitting control line EM, the third scan line Sn-2, the second scan line Sn-1, the first scan line Sn, the first gate electrode G1, the second gate electrode G2, the third gate electrode G3, the fourth gate electrode G4, the fifth gate electrode G5, the sixth gate electrode G6, and the seventh gate electrode G7 are formed on the same layer and made of the same material. Meanwhile, according to another exemplary embodiment, the emission control line EM, the third scan line Sn-2, the second scan line Sn-1, the first scan line Sn, the first gate electrode G1, the second gate electrode G2, the third gate electrode G3, the fourth gate electrode G4, the fifth gate electrode G5, the sixth gate electrode G6, and the seventh gate electrode G7 each are selectively formed on different layers and made of different materials.

The capacitor Cst includes one electrode and the other electrode which face each other, having the insulating layer therebetween. The above-mentioned one electrode can be the capacitor electrode CE and the other electrode can be the first gate electrode G1. The capacitor electrode CE is formed on the first gate electrode G1 and is connected to the driving power source line ELVDD through the contact hole.

The capacitor electrode CE forms the capacitor Cst along with the first gate electrode G1, and the first gate electrode G1 and the capacitor electrode CE are respectively formed of the same metal or the different metals in the different layers.

The capacitor electrode CE includes an opening OA exposing one portion of the first gate electrode G1, and the opening OA communicates with the first contact hole CNT1. The node line GB is connected to the first gate electrode G1 through the opening OA of the capacitor electrode CE and the first contact hole CNT1.

The data line DA is formed on the first scan line Sn to extend in the other direction crossing the first scan line Sn, and is connected to the second source electrode S2 of the second active pattern A2 through the contact hole. The data line DA extends across the first scan line Sn, the second scan line Sn-1, the third scan line Sn-2, and the emission control line EM.

The driving power source line ELVDD separated from the data line DA is formed on the first scan line Sn, extends in the other direction crossing the first scan line Sn, and is connected to the fifth source electrode S5 of the fifth active pattern A5 connected to the capacitor electrode CE and the first active pattern A1 through the contact hole. The driving power source line ELVDD extends across the first scan line Sn, the second scan line Sn-1, the third scan line Sn-2, and the emission control line EM.

The node line GB formed on the first scan line Sn is separated from the driving power source line ELVDD, is respectively connected to the third drain electrode D3 of the third active pattern A3 and the fourth drain electrode D4 of the fourth active pattern A4 through the first contact hole CNT1, and is connected to the first gate electrode G1 exposed by the opening OA of the capacitor electrode CE. That is, the node line GB respectively connects one first thin film transistor T1 to the third thin film transistor T3 and the fourth thin film transistor T4. The first contact hole CNT1 of the first pixel circuit PC1 passing through the node line GB has a first area in a plane, and has the smaller area than a second contact hole of the second pixel circuit that will be described later. The first contact hole CNT1 of the first pixel circuit PC1 passing through the node line GB overlaps the first channel C1 of the first active pattern A1, and can be formed in at least one insulating layer formed under the node line GB.

The node line GB is formed on the same layer and formed of the same material as the data line DA and the driving power source line ELVDD, respectively. Meanwhile, in another exemplary embodiment, the data line DA, the driving power source line ELVDD, and the node line GB are selectively formed on different layers and formed of different materials.

The initialization power line Vin is formed on the second scan line Sn-1 and is connected to the fourth source electrode S4 of the fourth active pattern A4 through the contact hole. The initialization power line Vin is formed on the same layer as the first electrode E1 of the OLED and is formed of the same material. According to another exemplary embodiment, the initialization power line Vin is formed on a different layer from the first electrode E1 and can be made of different materials.

The OLED includes the first electrode E1, an organic light emitting layer OL, and the second electrode E2. The first electrode E1 is connected to the sixth drain electrode D6 of the sixth thin film transistor T6 through the contact hole. The organic light emitting layer OL is formed between the first electrode E1 and the second electrode E2. The second electrode E2 is formed on the organic light emitting layer OL. At least one of the first electrode E1 and the second electrode E2 can be any one of a light transmitting electrode, a light reflective electrode, and a light translucent electrode, and light emitted from the organic light emitting layer OL can emitted in at least any one direction of the first electrode E1 and the second electrode E2.

A capping layer covering the OLED can be formed on the OLED, and a thin film encapsulation can be formed or an encapsulation substrate can be formed on the OLED, having the capping layer therebetween.

The second pixel PX2 is formed in the second region AR2 of the display area DIA of the substrate SUB to be separated from the first pixel PX1 formed in the first region AR1 of the display area DIA of the substrate SUB.

Figure 5:
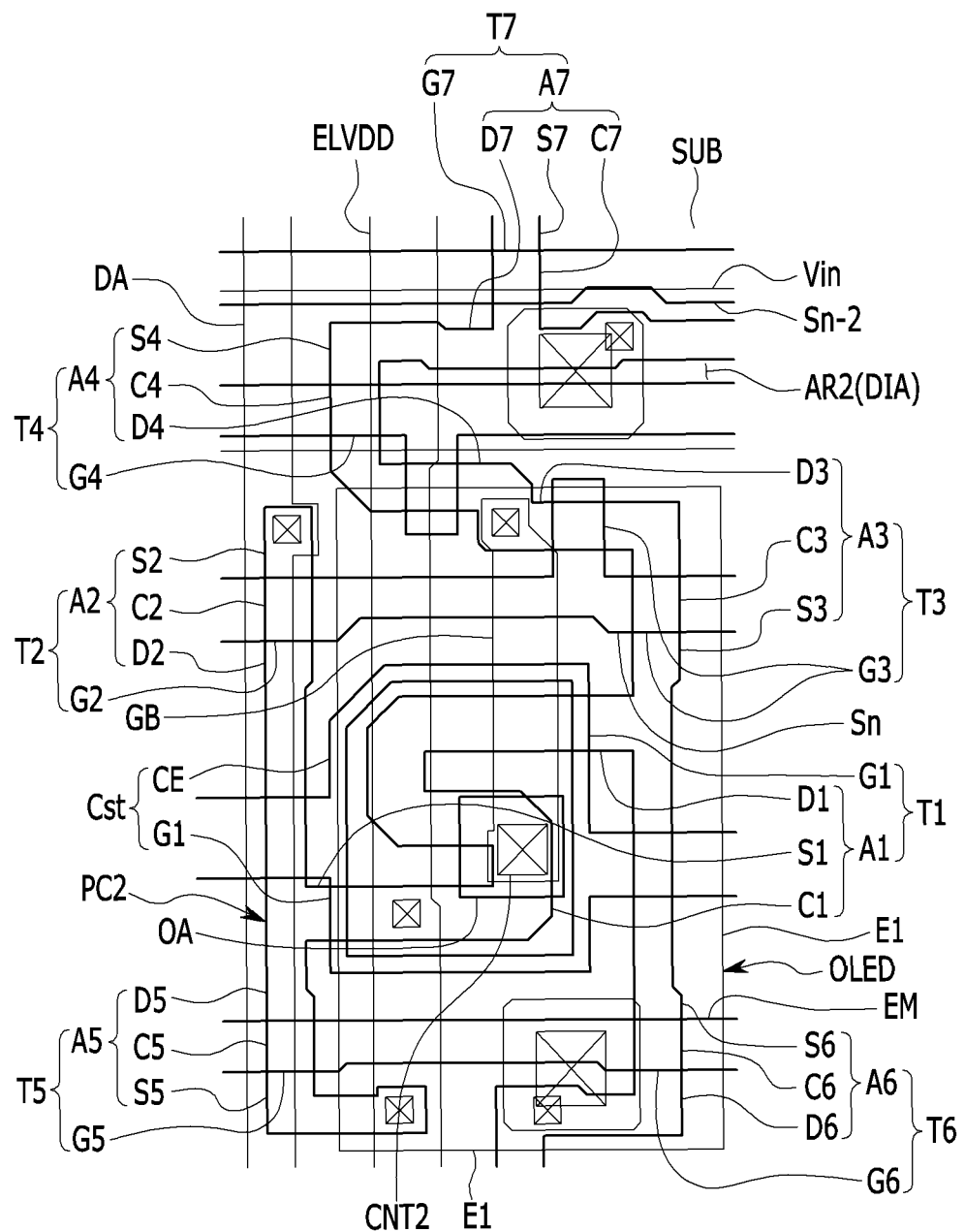
FIG. 5 is a layout view illustrating a second pixel of the OLED display according to an exemplary embodiment illustrated in FIG. 1.

FIG. 5 is a layout view of a second pixel of an OLED display according to an exemplary embodiment shown in FIG. 1.

Hereinafter, compared to the foregoing first pixel PX1, different portions of the second pixel PX2 will be described.

As illustrated in FIG. 5, the second pixel PX2 which is located in the second region EA of the display area DIA of the substrate SUB includes the first thin film transistor T1, the second thin film transistor T2, the third thin film transistor T3, the fourth thin film transistor T4, the fifth thin film transistor T5, the sixth thin film transistor T6, the seventh thin film transistor T7, the first scan line Sn, the second scan line Sn-1, the third scan line Sn-2, the emission control line EM, the capacitor Cst, the data line DA, the driving power source line ELVDD, a gate bridge GB, the initialization power source line Vin, and the OLED. Here, the first thin film transistor T1, the second thin film transistor T2, the third thin film transistor T3, the fourth thin film transistor T4, the fifth thin film transistor T5, the sixth thin film transistor T6, and the seventh thin film transistor T7 as the thin film transistors of the second pixel PX2, the node line GB, and the capacitor Cst form a second pixel circuit PC2 connected to the OLED. That is, the second pixel circuit PC2 is located in the second region AR2 of the display area DIA.

Among the thin film transistors included in the second pixel circuit PC2, the first thin film transistor T1 is connected to the OLED to function as the driving thin film transistor, and the second thin film transistor T2, the third thin film transistor T3, the fourth thin film transistor T4, the fifth thin film transistor T5, the sixth thin film transistor T6, and the seventh thin film transistor T7 can respectively function as switching thin film transistors connected to the first thin film transistor T1 of the driving thin film transistor.

In the second pixel circuit PC2, the first active pattern A1 of the first thin film transistor T1, the second active pattern A2 of the second thin film transistor T2, the third active pattern A3 of the third thin film transistor T3, the fourth active pattern A4 of the fourth thin film transistor T4, the fifth active pattern A5 of the fifth thin film transistor T5, the sixth active pattern A6 of the sixth thin film transistor T6, and the seventh active pattern A7 of the seventh thin film transistor T7 are connected to each other. The first active pattern A1, the second active pattern A2, the third active pattern A3, the fourth active pattern A4, the fifth active pattern A5, the sixth active pattern A6, and the seventh active pattern A7 can respectively have longer widths than each active pattern of the thin film transistors of the described first pixel circuit PC1. Here, the width of the active pattern can be the width of the active pattern in the direction crossing the extension direction of the active pattern.

That the first active pattern A1 of the second pixel circuit PC2 has a longer width than the first active pattern A1 of the first pixel circuit PC1 is a reason that the second pixel circuit PC2 is formed in the second region AR2 of the display area DIA closer to the non-display area NDA than the first region AR1 in which the first pixel circuit PC1 is formed. In the photolithography process forming the first active pattern A1 from one semiconductor layer, a photoresist material formed in the second region AR2 can be more or less exposed in the second region AR2 of the outer region compared to the first region AR1. For example, since the active pattern formed in the second region AR2 of the outer region adjacent to the data driver DD corresponds to the edge portion in which the active pattern is formed compared to the other outer region, the longer width compared to the other region is formed.

The node line GB of the second pixel circuit PC2 of the second pixel PX2 connects the third thin film transistor T3 to the first thin film transistor T1 through the second contact hole CNT2, and in detail, the node line GB contacts the first gate electrode G1 of the first thin film transistor T1 through the second contact hole CNT2.

The second contact hole CNT2 of the second pixel circuit PC2 formed in the second region AR2 of the display area DIA is different from the first contact hole CNT1 of the first pixel circuit PC1 formed in the first region AR1 of the display area DIA, and the second contact hole CNT2 of the second pixel circuit PC2 overlaps the first channel C1 of the first active pattern A1 to have the larger area compared to the first contact hole CNT1 of the first pixel circuit PC1 in the plane.

As described above, in an exemplary embodiment, the second contact hole CNT2 of the second pixel circuit PC2 of the second pixel PX2 formed in the second region AR2 of the display area DIA has the larger area compared to the first contact hole CNT1 of the first pixel circuit PC1 of the first pixel PX1 formed in the first region AR1 of the display area DIA.

Next, the OLED display according to an exemplary embodiment will be described with reference to FIG. 6 to FIG. 8.

Figure 6:
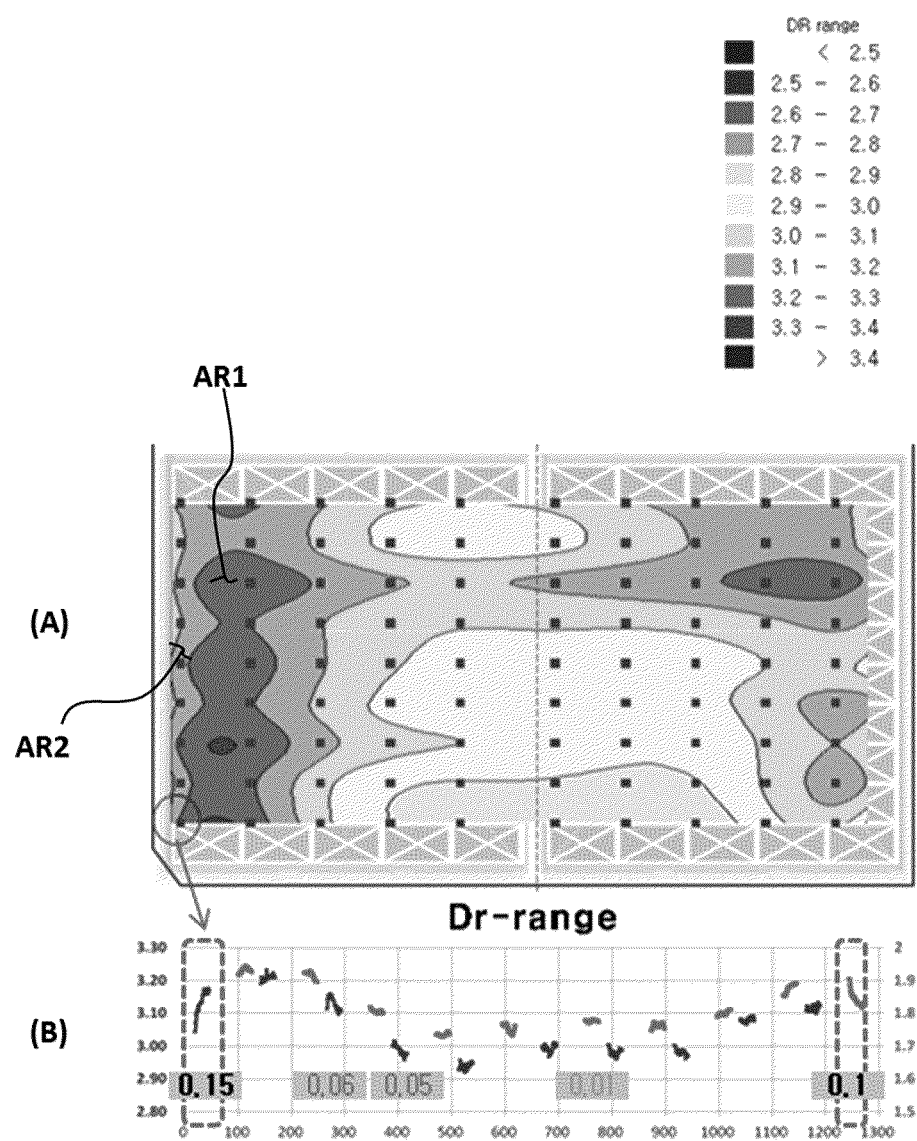
FIG. 6 is a view showing a driving range of a thin film transistor depending on the position thereof in an OLED display in one experimental example.

FIG. 6 shows the driving range of the thin film transistor depending on the position thereof in the OLED display in one experimental example. For example, FIG. 6 is the view showing the driving range (Dr-range) of the first thin film transistor as the driving thin film transistor in the entire plane position of the OLED display according to one experimental example. (A) is the view showing of the driving range of the first thin film transistor in the entire plane position of the OLED display. (B) is a graph showing of the driving range of the first thin film transistor in the entire plane position of the OLED display. An X-axis of (B) shows the entire position of the OLED display, and a Y-axis shows a magnitude of the driving range of the first thin film transistor.

As shown in FIG. 6, the driving ranges of the first thin film transistors connected to the organic light emitting elements are different depending on the plane position throughout the entire plane of the OLED display in one experimental example. For example, the material of the photoresist formed in the different regions among the photolithography process forming the first active pattern of the first thin film transistor from one semiconductor layer is further or less exposed in the second region AR2 that is the outer region compared to the first region AR1 such that the driving range of the first thin film transistor formed in the second region AR2 is different from the driving range of the first thin film transistor formed in the first region AR1.

For example, the first active pattern formed in the second region AR2 has the longer width compared to the first active pattern formed in the first region AR1 by the process error such that the thin film transistor characteristic of the first thin film transistor formed in the second region AR2 is improved compared to the first thin film transistor formed in the first region AR1. The driving range of the first thin film transistor formed in the second region AR2 is lower compared to the driving range of the first thin film transistor formed in the first region AR1.

To solve these problems, the six thin film transistors are described below and the difference of the driving range depending on each structure of six thin film transistors are shown.

FIG. 7 is a view respectively showing a plurality of thin film transistors having different conditions in another experimental example.

As shown in FIG. 7, the thin film transistors of No. 1 to No. 6 having the different positions of the contact holes are shown, and the sizes of the contact holes are different from each other at 1.8 um, 2.0 um, 2.2 um, 2.4 um, and 2.6 um. Among the thin film transistors of No. 1 to No. 6, in the second and third thin film transistors, the contact hole overlaps the channel of the active pattern.

Figure 8:
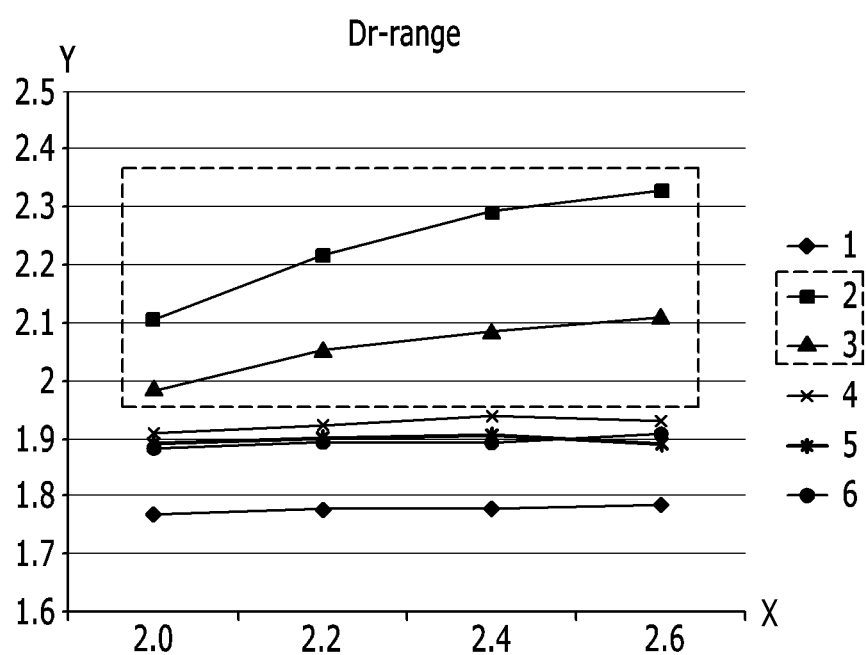
FIG. 8 is a graph showing each driving range of a plurality of thin film transistors shown in FIG. 7.

FIG. 8 is a graph showing each driving range of a plurality of thin film transistors shown in FIG. 7. In FIG. 8, the X-axis represents the size of the contact hole in V and the Y-axis represents the driving range of the thin film transistor in um.

As shown in FIG. 8, the driving range of the second and third thin film transistors in which the contact hole overlaps the channel of the active pattern among the thin film transistors of No. 1 to No. 6 having the different positions of the contact holes is substantially proportional to the size of the contact hole of the driving range.

The driving range of the thin film transistor increases as the size of the contact hole overlapping the channel of the active pattern of the thin film transistor is increased.

The active pattern of the thin film transistor is heat-treated in the state that the contact hole is formed in the insulating layer covering the active pattern, since dangling bonds of the active pattern are not smoothly removed in proportion to the portion and the size of the contact hole, and the driving range of the thin film transistor increases as the size of the contact hole overlapping the channel of the active pattern is increased.

Next, an effect of an OLED display according to an exemplary embodiment will be described with reference to FIG. 9.

Figure 9:
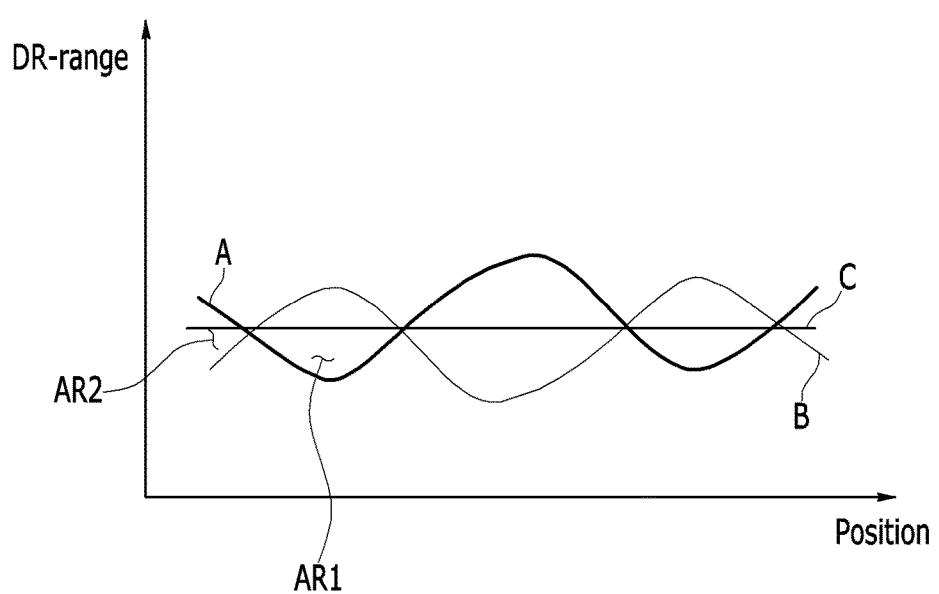
FIG. 9 is a graph for explaining an effect of an OLED display according to an exemplary embodiment.

FIG. 9 is a graph to explain an effect of an OLED display according to an exemplary embodiment. In FIG. 9, the X-axis represents the entire position of the OLED display, and the Y-axis represents the size of the driving range (DR-range) of the first thin film transistor corresponding to the entire position of the OLED display.

In FIG. 9, a line B represents the driving range of the first thin film transistor for each position of the OLED display depending on the process, a line A represents a predicted driving range of the first thin film transistor for each position of the OLED display according to a position compensation design of the contact hole passing through the node line, and a line C represents the driving range of the first thin film transistor for each position of the actual OLED display.

As shown in FIG. 9, in the OLED display according to an exemplary embodiment, the second contact hole formed in the second region AR2 has the larger area compared to that of the first contact hole of the first pixel circuit formed in the pixel circuit region AR1. Since the driving range of the first thin film transistor of the second pixel circuit formed in the second region AR2 and the driving range of the first thin film transistor of the first pixel circuit formed in the first region AR1 is deteriorated, each characteristic of the first thin film transistor of the first region AR1 and the first thin film transistor of the second region AR2 is minimized.

That is, due to manufacturing errors, throughout the OLED display, the driving range deviation of the first thin film transistor can be generated like the line B. However, by designing the first thin film transistor in the OLED display to be like the line A, the driving range deviation of the first thin film transistor is minimized like the line C throughout the OLED display.

As described above, due to manufacturing errors, the driving range of the first thin film transistor T1 of the second pixel circuit PC2 formed in the second region AR2 of the display area DIA can deteriorate compared to the driving range of the first thin film transistor T1 of the first pixel circuit PC1 formed in the first region AR1. However, in some example embodiments, the second contact hole CNT2 overlapping the first active pattern A1 of the first thin film transistor T1 of the second pixel circuit PC2 has the larger area in the plane compared to the first contact hole CNT1 overlapping the first active pattern A1 of the first thin film transistor T1 of the first pixel circuit PC1. Since the transistor characteristic of the first thin film transistor T1 of the second pixel circuit PC2 is deteriorated such that the driving range of the first thin film transistor T1 is increased, the differences between the first thin film transistor T1 of the first pixel circuit PC1 and the first thin film transistor T1 of the second pixel circuit PC2 are minimized.

For example, the transistor characteristic (e.g., current amount) of the thin film transistor formed in the second region AR2 can be improved to resolve a photolithography process error by forming the area of the second contact hole CNT2 formed in the second region AR2 to be larger than the area of the first contact hole CNT1 formed in the first region AR1. The transistor characteristic difference between the thin film transistors formed throughout the entire display area DIA of the substrate SUB is minimized such that the luminance difference of the organic light emitting elements connected to the thin film transistors is minimized. Accordingly, the OLED display with the minimized display quality deterioration of the image is provided.

For example, even if the difference is undesirably generated in the width of each active pattern of the thin film transistors throughout the entire substrate SUB, the OLED display, in which the current supplied to the OLED is suppressed from having the difference throughout the entire substrate SUB, is provided.

Next, the OLED display according to another exemplary embodiment will be described with reference to FIG. 10. Hereafter, differences from the OLED display according to the above exemplary embodiment will be described.

Figure 10:
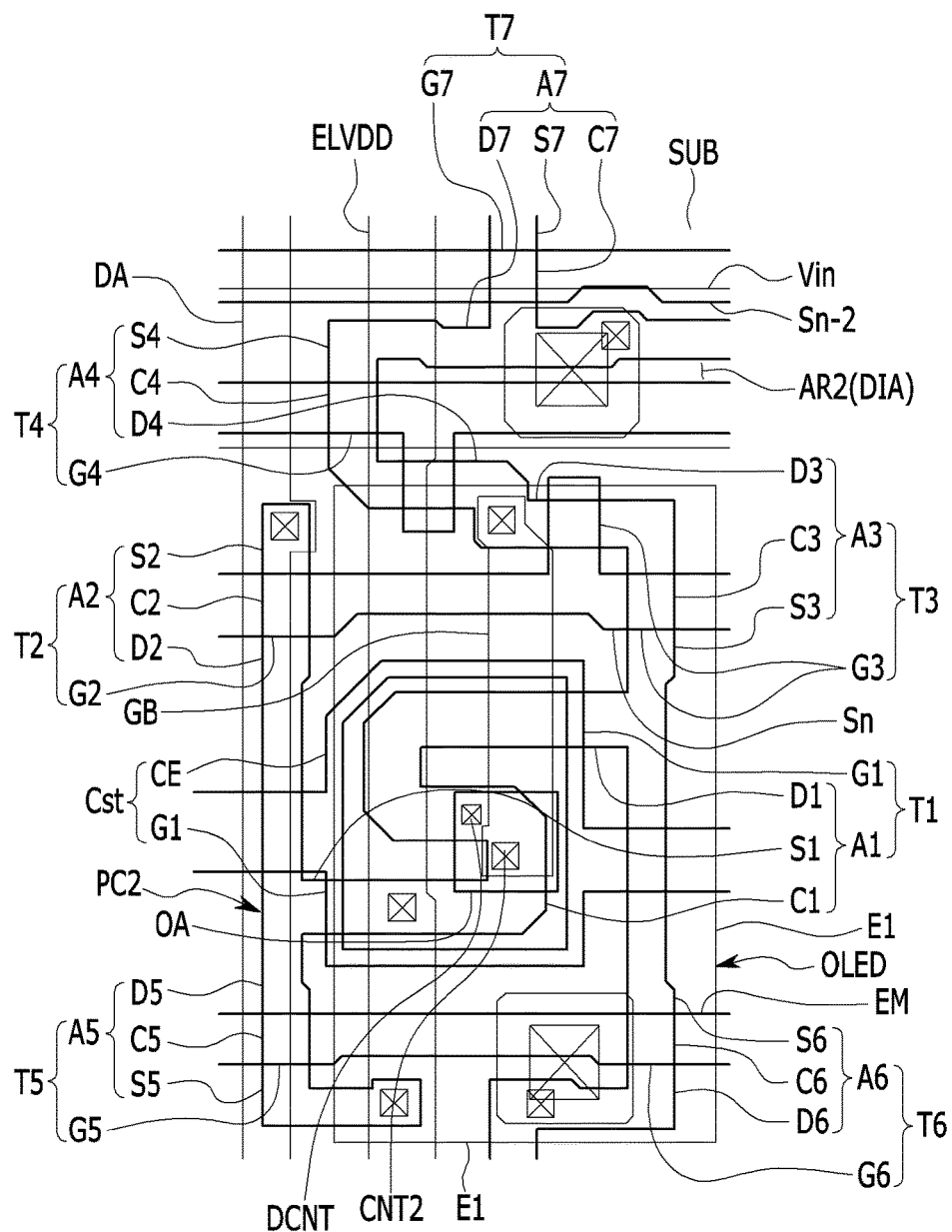
FIG. 10 is a layout view illustrating a second pixel of an OLED display according to another exemplary embodiment.

FIG. 10 is a layout view of a second pixel of an OLED display according to another exemplary embodiment.

As illustrated in FIG. 10, the second pixel PX2 which is located in the second area AR2 of the display area DIA of the substrate SUB includes the first thin film transistor T1, the second thin film transistor T2, the third thin film transistor T3, the fourth thin film transistor T4, the fifth thin film transistor T5, the sixth thin film transistor T6, the seventh thin film transistor T7, the first scan line Sn, the second scan line Sn-1, the third scan line Sn-2, the emission control line EM, the capacitor Cst, the data line DA, the driving power supply line ELVDD, the node line GB, the initialization power supply line Vin, and the OLED. Here, the first thin film transistor T1, the second thin film transistor T2, the third thin film transistor T3, the fourth thin film transistor T4, the fifth thin film transistor T5, the sixth thin film transistor T6, and the seventh thin film transistor T7 as the thin film transistors of the second pixel PX2, the node line GB, and the capacitor Cst form the second pixel circuit PC2 connected to the OLED. That is, the second pixel circuit PC2 is formed in the second region AR2 of the display area DIA.

Among the thin film transistors included in the second pixel circuit PC2, the first thin film transistor T1 is connected to the OLED to function as the driving thin film transistor, and the second thin film transistor T2, the third thin film transistor T3, the fourth thin film transistor T4, the fifth thin film transistor T5, the sixth thin film transistor T6, and the seventh thin film transistor T7 can respectively function as switching thin film transistors connected to the first thin film transistor T1 of the driving thin film transistor.

In the second pixel circuit PC2, the first active pattern A1 of the first thin film transistor T1, the second active pattern A2 of the second thin film transistor T2, the third active pattern A3 of the third thin film transistor T3, the fourth active pattern A4 of the fourth thin film transistor T4, the fifth active pattern A5 of the fifth thin film transistor T5, the sixth active pattern A6 of the sixth thin film transistor T6, and the seventh active pattern A7 of the seventh thin film transistor T7 are connected to each other, and the first active pattern A1, the second active pattern A2, the third active pattern A3, the fourth active pattern A4, the fifth active pattern A5, the sixth active pattern A6, and the seventh active pattern A7 can respectively have the longer width than each active pattern of the thin film transistors of the described first pixel circuit PC1.

The node line GB of the second pixel circuit PC2 of the second pixel PX2 connects between the third thin film transistor T3 and the first thin film transistor T1 through the second contact hole CNT2. For example, the node line GB contacts the first gate electrode G1 of the first thin film transistor T1 through the second contact hole CNT2.

The second contact hole CNT2 of the second pixel circuit PC2 formed in the second region AR2 of the display area DIA is different from the first contact hole CNT1 of the first pixel circuit PC1 formed in the first region AR1 of the display area DIA, and the second pixel circuit PC2 further includes an additional contact hole DCNT adjacent to the second contact hole CNT2.

Here, the additional contact hole DCNT can be formed as a dummy; however it is not limited thereto.

As described above, in another exemplary embodiment, the second pixel circuit PC2 of the second pixel PX2 formed in the second region AR2 of the display area DIA further includes the additional contact hole DCNT adjacent to the second contact hole CNT2.

The additional contact hole DCNT overlaps the first channel C1 of the first active pattern A1 of the first thin film transistor T1, however it is not limited thereto, and in some embodiments, the additional contact hole DCNT does not overlap the first channel C1. Also, there can be multiple additional contact holes DCNT.

As described above, in the OLED display according to another exemplary embodiment, the driving range of the first thin film transistor T1 of the second pixel circuit PC2 formed in the second region AR2 of the display area DIA is deteriorated compared to the driving range of the first thin film transistor T1 of the first pixel circuit PC1 formed in the first region AR1 due to the process error. However, the second pixel circuit PC2 includes the second contact hole CNT2 and the additional contact hole DCNT overlapping the first active pattern A1 of the first thin film transistor T1. Even though the transistor characteristic of the first thin film transistor T1 of the second pixel circuit PC2 is deteriorated such that the driving range of the first thin film transistor T1 is increased, each transistor characteristic difference of the first thin film transistor T1 of the first pixel circuit PC1 and the first thin film transistor T1 of the second pixel circuit PC2 is minimized.

That is, the transistor characteristic of the thin film transistor formed in the second region AR2 is improved to fix problem caused by the photolithography process error. The second contact hole CNT2 and the additional contact hole DCNT are formed in the second region AR2, and even though the transistor characteristic of the thin film transistor formed in the second region AR2 is deteriorated, the transistor characteristic difference between the thin film transistors formed throughout the display area DIA of the substrate SUB is minimized such that the luminance difference of the organic light emitting elements connected to the thin film transistors is minimized. Accordingly, the OLED display with the minimized display quality deterioration of the image is provided.

For example, even if a difference is undesirably generated in the width of each active pattern of the thin film transistors throughout the entire substrate SUB, the OLED display, in which the current supplied to the OLED is suppressed from having the difference throughout the entire substrate SUB, is provided.

Next, the OLED display according to another exemplary embodiment will be described with reference to FIG. 11. Hereafter, differences from the OLED display according to the above exemplary embodiment will be described.

Figure 11:
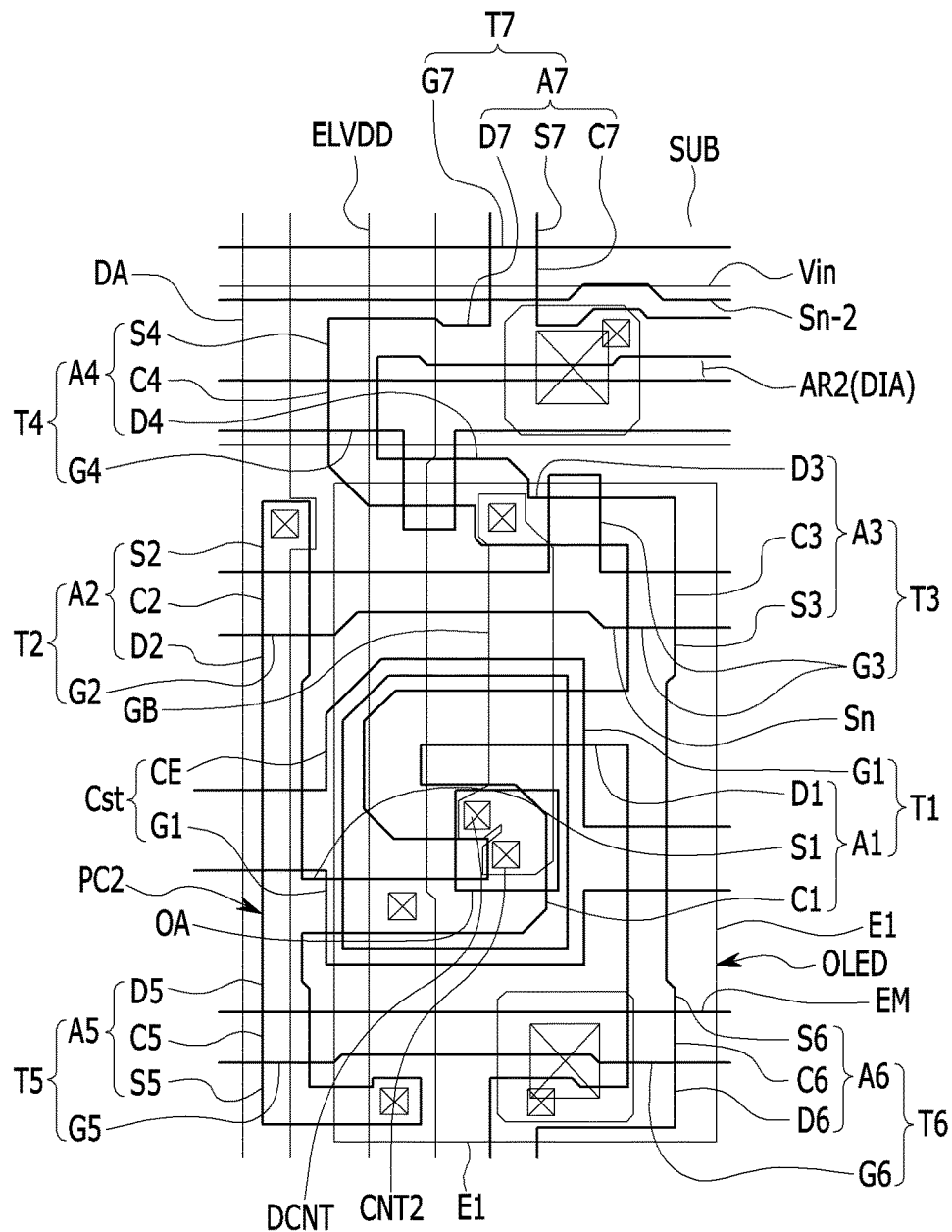
FIG. 11 is a layout view illustrating a second pixel of an OLED display according to another exemplary embodiment.

FIG. 11 is a layout view showing a second pixel of an OLED display according to another exemplary embodiment.

As illustrated in FIG. 11, the second pixel PX2 which is located in the second area AR2 of the display area DIA of the substrate SUB includes the first thin film transistor T1, the second thin film transistor T2, the third thin film transistor T3, the fourth thin film transistor T4, the fifth thin film transistor T5, the sixth thin film transistor T6, the seventh thin film transistor T7, the first scan line Sn, the second scan line Sn-1, the third scan line Sn-2, the light emission control line EM, the capacitor Cst, the data line DA, the driving power supply line ELVDD, the node line GB, the initialization power supply line Vin, and the OLED. Here, the first thin film transistor T1, the second thin film transistor T2, the third thin film transistor T3, the fourth thin film transistor T4, the fifth thin film transistor T5, the sixth thin film transistor T6, and the seventh thin film transistor T7 as the thin film transistors of the second pixel PX1, the node line GB, and the capacitor Cst form the second pixel circuit PC2 connected to the OLED. That is, the second pixel circuit PC2 is formed in the second region AR2 of the display area DIA.

Among the thin film transistors included in the second pixel circuit PC2, the first thin film transistor T1 is connected to the OLED to function as the driving thin film transistor, and the second thin film transistor T2, the third thin film transistor T3, the fourth thin film transistor T4, the fifth thin film transistor T5, the sixth thin film transistor T6, and the seventh thin film transistor T7 can respectively function as switching thin film transistors connected to the first thin film transistor T1 of the driving thin film transistor.

In the second pixel circuit PC2, the first active pattern A1 of the first thin film transistor T1, the second active pattern A2 of the second thin film transistor T2, the third active pattern A3 of the third thin film transistor T3, the fourth active pattern A4 of the fourth thin film transistor T4, the fifth active pattern A5 of the fifth thin film transistor T5, the sixth active pattern A6 of the sixth thin film transistor T6, and the seventh active pattern A7 of the seventh thin film transistor T7 are connected to each other, and the first active pattern A1, the second active pattern A2, the third active pattern A3, the fourth active pattern A4, the fifth active pattern A5, the sixth active pattern A6, and the seventh active pattern A7 can respectively have the longer width than each active pattern of the thin film transistors of the described first pixel circuit PC1.

The node line GB of the second pixel circuit PC2 of the second pixel PX2 connects between the third thin film transistor T3 and the first thin film transistor T1 through the second contact hole CNT2 and the additional contact hole DCNT. For example, the node line GB contacts the first gate electrode G1 of the first thin film transistor T1 through the second contact hole CNT2 and the additional contact hole DCNT.

The second contact hole CNT2 of the second pixel circuit PC2 formed in the second region AR2 of the display area DIA is different from the first contact hole CNT1 of the first pixel circuit PC1 formed in the first region AR1 of the display area DIA, and the second pixel circuit PC2 further includes an additional contact hole DCNT adjacent to the second contact hole CNT2.

Here, the node line GB contacts the first gate electrode G1 through the second contact hole CNT2 and the additional contact hole DCNT. However the embodiment is not limited thereto, and the node line GB can contact the first gate electrode G1 through at least one of the second contact hole CNT2 and the additional contact hole DCNT.

As described above, in another exemplary embodiment, the second pixel circuit PC2 of the second pixel PX2 formed in the second region AR2 of the display area DIA further includes the additional contact hole DCNT adjacent to the second contact hole CNT2.

The additional contact hole DCNT overlaps the first channel C1 of the first active pattern A1 of the first thin film transistor T1. However it is not limited thereto, and in some embodiments, the additional contact hole DCNT not overlap the first channel C1. Also, there can be multiple additional contact holes DCNT.

As described above, when the driving range of the first thin film transistor T1 of the second pixel circuit PC2 formed in the second region AR2 of the display area DIA is deteriorated compared to the driving range of the first thin film transistor T1 of the first pixel circuit PC1 formed in the first region AR1 due to the process error, in some embodiments, the second pixel circuit PC2 includes the second contact hole CNT2 and the additional contact hole DCNT overlapping the first active pattern A1 of the first thin film transistor T1. So, even though the transistor characteristic of the first thin film transistor T1 of the second pixel circuit PC2 is deteriorated such that the driving range of the first thin film transistor T1 is increased, each transistor characteristic difference of the first thin film transistor T1 of the first pixel circuit PC1 and the first thin film transistor T1 of the second pixel circuit PC2 is minimized.

That is, the transistor characteristic of the thin film transistor formed in the second region AR2 is improved, since the second contact hole CNT2 and the additional contact hole DCNT are formed in the second region AR2. Since the transistor characteristic of the thin film transistor formed in the second region AR2 is deteriorated due to a manufacturing error, the transistor characteristic difference between the thin film transistors formed throughout the display area DIA of the substrate SUB is minimized such that the luminance difference of the organic light emitting elements connected to the thin film transistors is minimized. Accordingly, the OLED display with the minimized display quality deterioration of the image is provided.

For example, even if the difference is undesirably generated in the width of each active pattern of the thin film transistors throughout the entire substrate SUB, the OLED display, in which the current supplied to the OLED is suppressed from having the difference throughout the entire substrate SUB, is provided.

Next, the OLED display according to another exemplary embodiment will be described with reference to FIG. 12 and FIG. 13. Hereafter, differences from the OLED display according to the above exemplary embodiment will be described.

Figure 12:
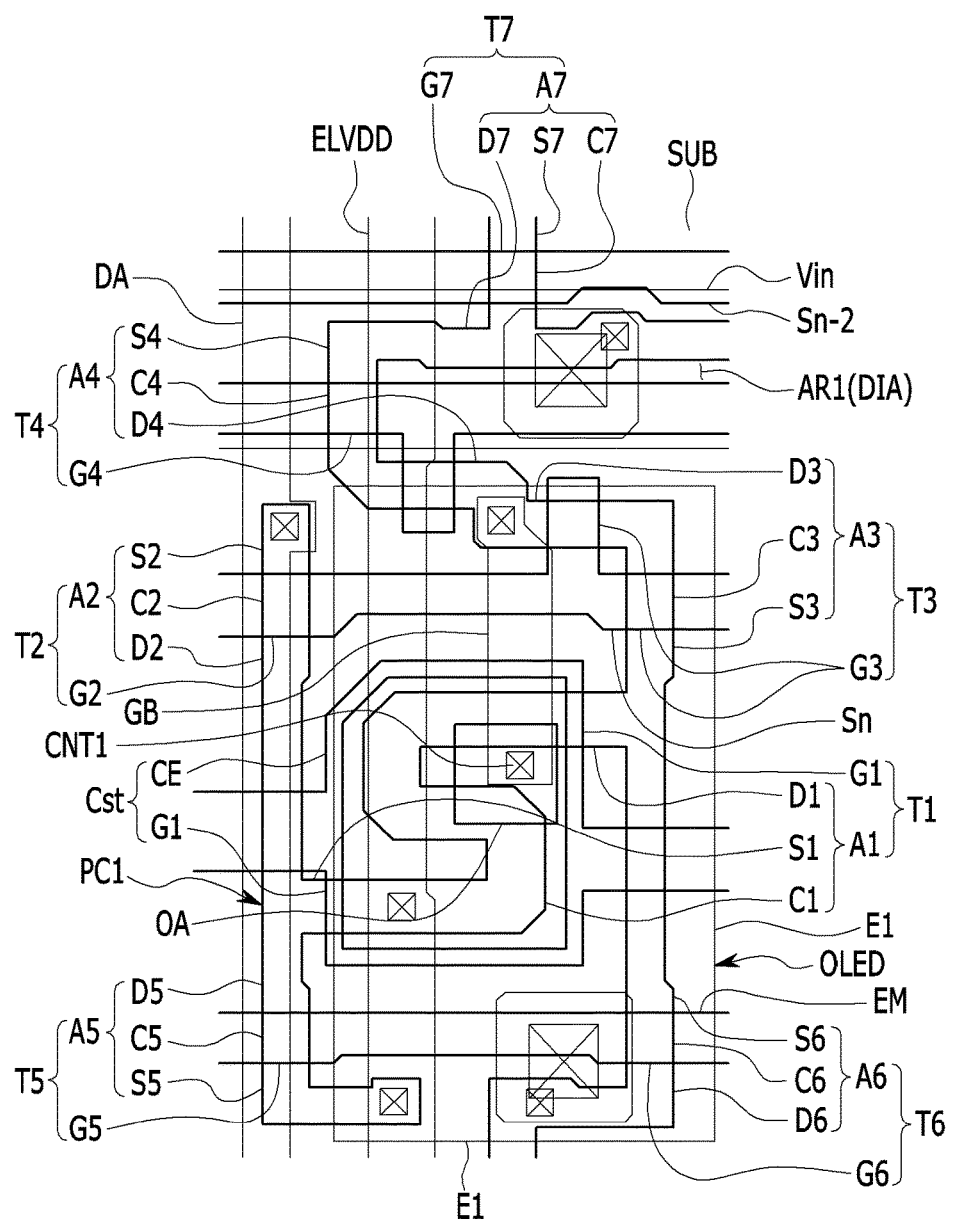
FIG. 12 is a layout view illustrating a first pixel of an OLED display according to another exemplary embodiment.

FIG. 12 is a layout view illustrating a first pixel of an OLED display according to another exemplary embodiment. FIG. 13 is a layout view illustrating a second pixel of an OLED display according to another exemplary embodiment.

As shown in FIG. 12, the first contact hole CNT1 of the first pixel circuit PC1 of the first pixel PX1 does not overlap the first channel C1 of the first active pattern A1 of the first thin film transistor T1 of the driving thin film transistor.

Figure 13:
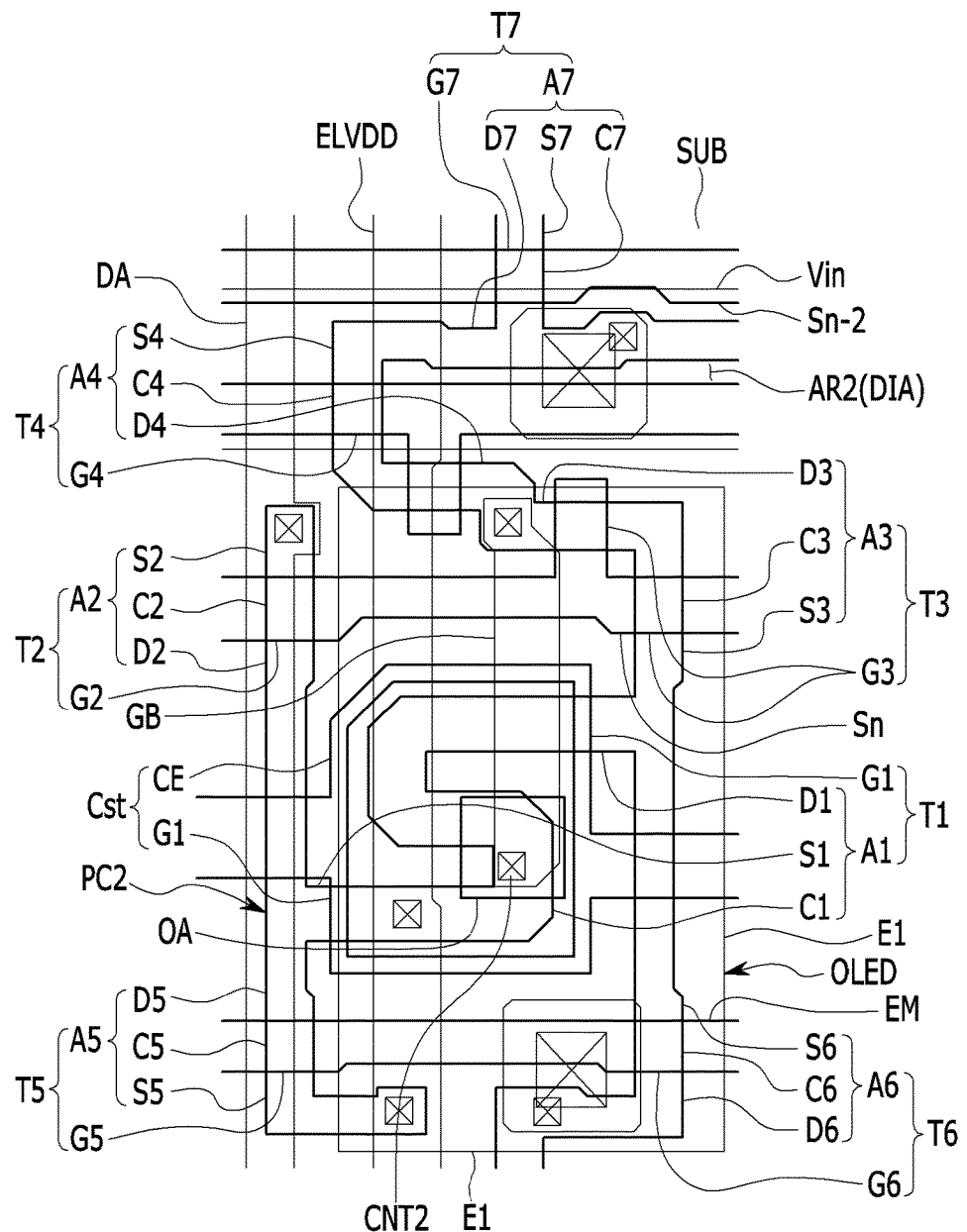
FIG. 13 is a layout view illustrating a second pixel of an OLED display according to another exemplary embodiment.

As shown in FIG. 13, the second contact hole CNT2 of the second pixel circuit PC2 of the second pixel PX2 overlaps the first channel C1 of the first active pattern A1 of the first thin film transistor T1 as the driving thin film transistor.

As described above, in another exemplary embodiment, the second contact hole CNT2 of the second pixel circuit PC2 of the second pixel PX2 formed in the second region AR2 of the display area DIA overlaps the first channel C1 of the first active pattern A1, differently from the first contact hole CNT1 of the first pixel circuit PC1 of the first pixel PX1 formed in the first region AR1.

As described above, in the OLED display according to another exemplary embodiment, when the driving range of the first thin film transistor T1 of the second pixel circuit PC2 formed in the second region AR2 of the display area DIA is deteriorated compared to the driving range of the first thin film transistor T1 of the first pixel circuit PC1 formed in the first region AR1 due to a process error, the first contact hole CNT1 of the first pixel circuit PC1 does not overlap the first active pattern A1 and the second contact hole CNT2 of the second pixel circuit PC2 overlaps the first active pattern A1. Since the transistor characteristic of the first thin film transistor T1 of the second pixel circuit PC2 is deteriorated such that the driving range of the first thin film transistor T1 is increased, each transistor characteristic difference of the first thin film transistor T1 of the first pixel circuit PC1 and the first thin film transistor T1 of the second pixel circuit PC2 is minimized.

That is, when the second contact hole CNT2 of the second region AR2 overlaps the first active pattern A1 while the first contact hole CNT1 of the first region AR1 does not overlap the first active pattern A1, the transistor characteristic of the thin film transistor formed in the second region AR2 is improved. Even though the transistor characteristic of the thin film transistor formed in the second region AR2 is deteriorated due to the process error, the transistor characteristic difference between the thin film transistors throughout the entire display area DIA of the substrate SUB is minimized such that the luminance difference of the organic light emitting elements connected to the thin film transistors is minimized. Accordingly, the OLED display with the minimized display quality deterioration of the image is provided.

For example, even if the difference is undesirably generated in the width of each active pattern of the thin film transistors throughout the entire substrate SUB, the OLED display, in which the current supplied to the OLED is suppressed from having the difference throughout the entire substrate SUB, is provided.

Next, the OLED display according to another exemplary embodiment will be described with reference to FIG. 14 and FIG. 15. Hereafter, differences from the OLED display according to the above exemplary embodiment will be described.

Figure 14:
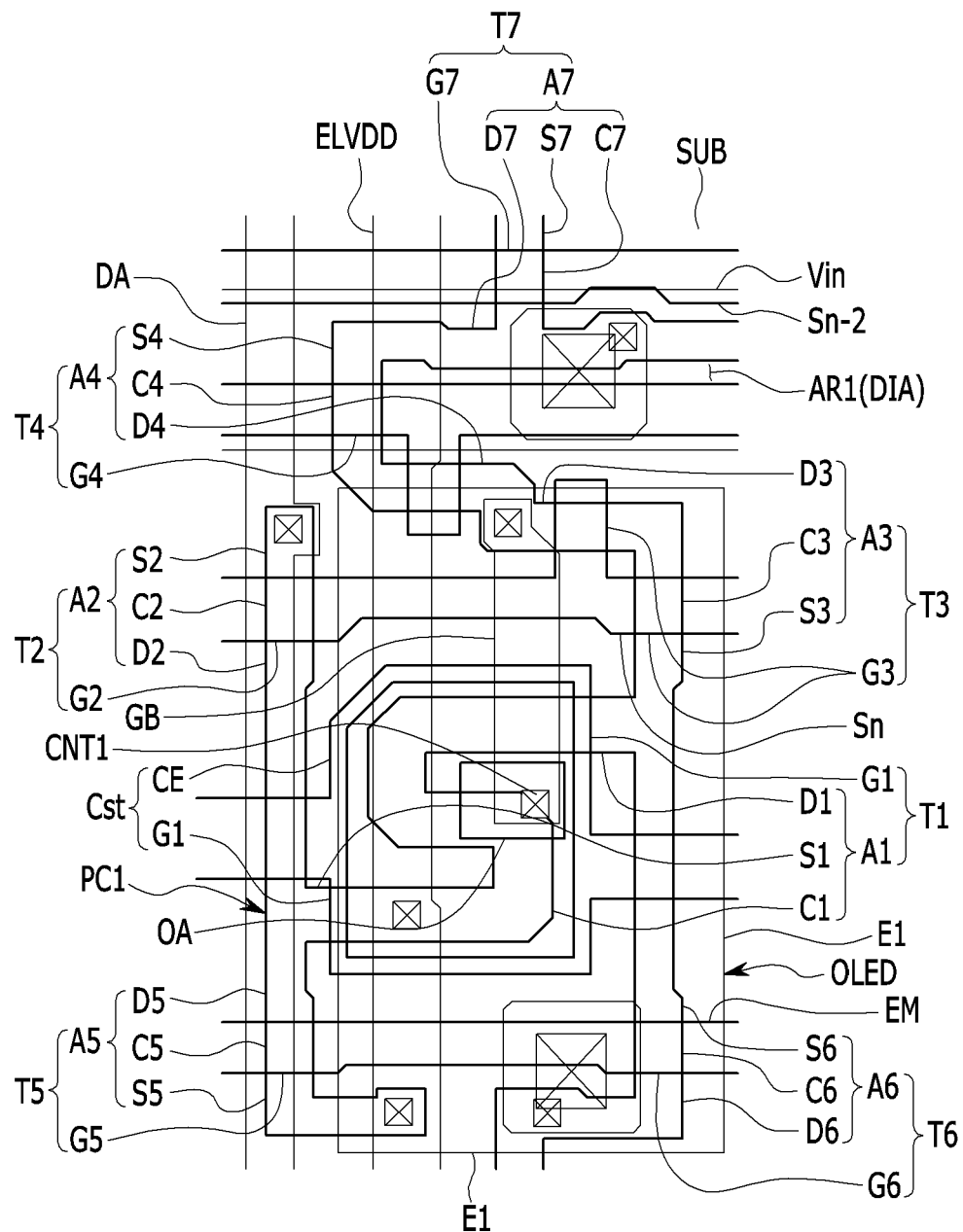
FIG. 14 is a layout view illustrating a first pixel of an OLED display according to another exemplary embodiment.

FIG. 14 is a layout view illustrating a first pixel of an OLED display according to another exemplary embodiment. FIG. 15 is a layout view illustrating a second pixel of an OLED display according to another exemplary embodiment.

As shown in FIG. 14, a portion of the first contact hole CNT1 of the first pixel circuit PC1 of the first pixel PX1 overlaps the first channel C1 of the first active pattern A1 of the first thin film transistor T1 as the driving thin film transistor.

Figure 15:
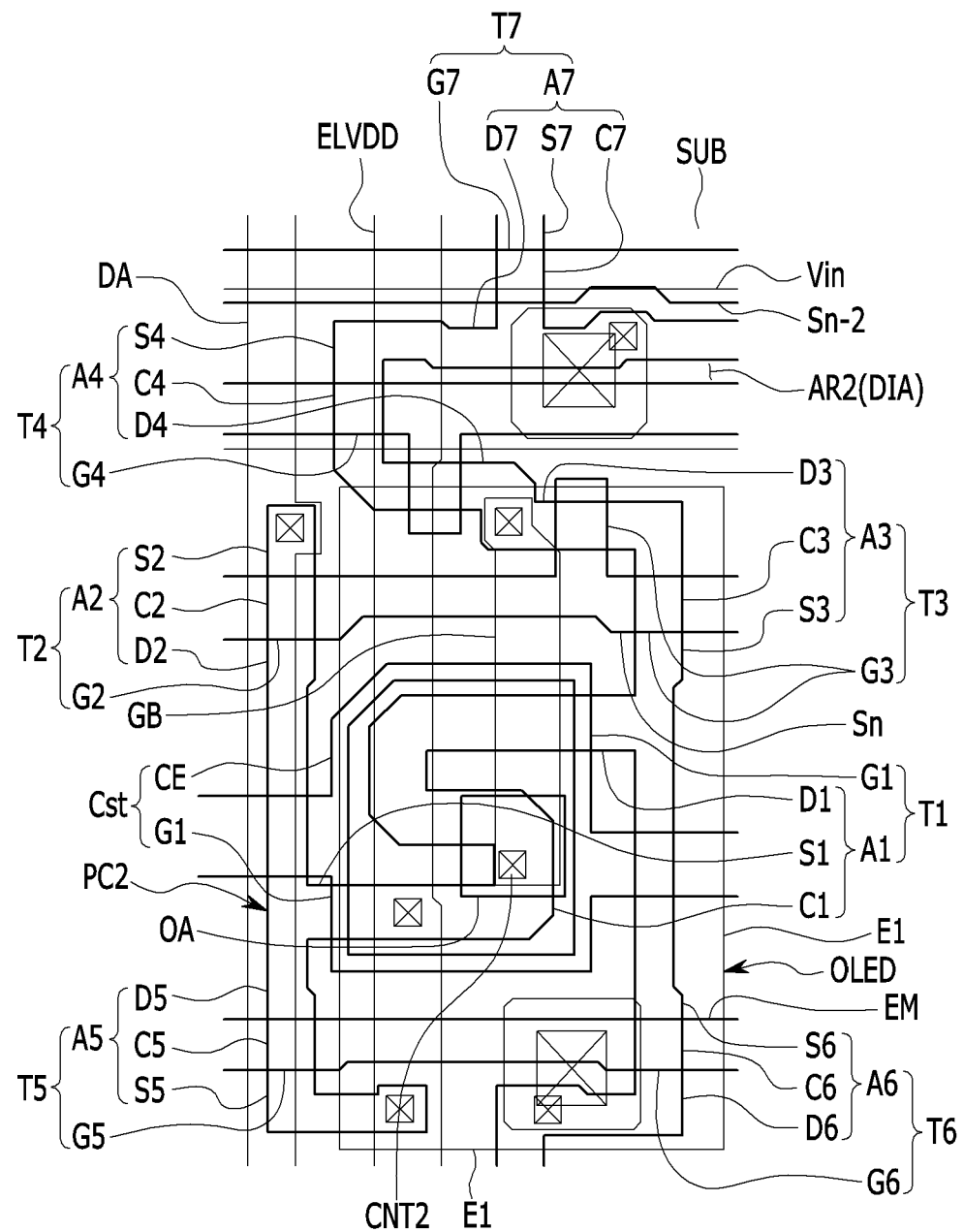
FIG. 15 is a layout view illustrating a second pixel of an OLED display according to another exemplary embodiment.

As shown in FIG. 15, the second contact hole CNT2 of the second pixel circuit PC2 of the second pixel PX2 completely overlaps the first channel C1 of the first active pattern A1 of the first thin film transistor T1 as the driving thin film transistor.

On the other hand, in another exemplary embodiment, the second contact hole CNT2 of the second pixel circuit PC2 partially overlaps the first channel C1 of the first active pattern A1 of the first thin film transistor T1.

That is, the second contact hole CNT2 of the second pixel circuit PC2 overlaps the first active pattern A1 of the first thin film transistor T1 as the driving thin film transistor with the wider area compared to the first contact hole CNT1 of the first pixel circuit PC1.

As described above, in another exemplary embodiment, the second contact hole CNT2 of the second pixel circuit PC2 of the second pixel PX2 formed in the second region AR2 of the display area DIA overlaps the first channel C1 of the first active pattern A1 with the wider area, differently from the first contact hole CNT1 of the first pixel circuit PC1 of the first pixel PX1 formed in the first region AR1.

As described above, in the OLED display according to another exemplary embodiment, when the driving range of the first thin film transistor T1 of the second pixel circuit PC2 formed in the second region AR2 of the display area DIA is deteriorated compared to the driving range of the first thin film transistor T1 of the first pixel circuit PC1 formed in the first region AR1 by the process error, the first contact hole CNT1 of the first pixel circuit PC1 overlaps the first active pattern A1 with the narrow area and the second contact hole CNT2 of the second pixel circuit PC2 overlaps the first active pattern A1 with the wide area. Even though the transistor characteristic of the first thin film transistor T1 of the second pixel circuit PC2 is deteriorated such that the driving range of the first thin film transistor T1 is increased, each transistor characteristic difference of the first thin film transistor T1 of the first pixel circuit PC1 and the first thin film transistor T1 of the second pixel circuit PC2 is minimized.

That is, the transistor characteristic of the thin film transistor formed in the second region AR2 is improved, since the second contact hole CNT2 of the second region AR2 overlaps the first active pattern A1 with the wide area while the first contact hole CNT1 of the first region AR1 overlaps the first active pattern A1 with the narrow area. So, even though the transistor characteristic of the thin film transistor formed in the second region AR2 is deteriorated, the transistor characteristic difference between the thin film transistors formed throughout the entire display area DIA of the substrate SUB is minimized such that the luminance difference of the organic light emitting elements connected to the thin film transistors is minimized. Accordingly, the OLED display with the minimized display quality deterioration of the image is provided.

Even if the difference is undesirably generated in the width of each active pattern of the thin film transistors throughout the entire substrate SUB, the OLED display, in which the current supplied to the OLED is suppressed from having the difference throughout the entire substrate SUB, is provided.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
    a substrate including a display area displaying an image, wherein the display area includes first and second regions;
    a plurality of OLEDs disposed on the display area and separated from one another; and
    a plurality of pixel circuits disposed on the display area and including a first pixel circuit in the first region and a second pixel circuit in the second region, wherein first and second contact holes are respectively formed in the first and second pixel circuits, wherein each pixel circuit includes i) a plurality of thin film transistors (TFTs) including first and second TFTs and electrically connected to the OLEDs and ii) a node line electrically connecting the first TFT to the second TFT through the first and second contact holes,
    wherein the first contact hole is different from the second contact hole.

2. The OLED display of claim 1, wherein the substrate further includes a non-display area surrounding the display area, and
    wherein the second region of the display area is closer to the non-display area than the first region.

3. The OLED display of claim 1, wherein the second contact hole is greater in area than the first contact hole.

4. The OLED display of claim 1, wherein the second pixel circuit further includes a third contact hole located adjacent to the second contact hole.

5. The OLED display of claim 4, wherein the TFTs include third and fourth TFTs, and wherein the node line of the second pixel circuit electrically connects the third TFT to the fourth TFT through the third contact hole.

6. The OLED display of claim 1, wherein TFTs include:
    a driving TFT electrically connected to the OLED; and
    at least one switching TFT electrically connected to the driving TFT.

7. The OLED display of claim 6, wherein the second contact hole overlaps an active pattern of the driving TFT in the depth dimension of the OLED display.

8. The OLED display of claim 7, wherein the first contact hole does not overlap the active pattern of the driving TFT in the depth dimension of the OLED display.

9. The OLED display of claim 7, wherein the first contact hole overlaps the active pattern of the driving TFT in the depth dimension of the OLED display, and
    wherein the second contact hole overlaps the active pattern of the driving TFT and has an area wider than an area of the first contact hole.

10. The OLED display of claim 1, further comprising a data line disposed on the substrate and extending in one direction, wherein the data line is electrically connected to the TFTs, and
    wherein the TFTs include:
        the first TFT disposed on the substrate and including i) a first active pattern electrically connected to the OLED and ii) a first gate electrode disposed on the first active pattern and electrically connected to the node line through the first contact hole;
        the second TFT electrically connected to a first end of the first active pattern and including i) a second active pattern connected to the data line and ii) a second gate electrode disposed on the second active pattern; and
        a third TFT electrically connected to a second end of the first active pattern and including i) a third active pattern connected to the first gate electrode through the node line and ii) a third gate electrode disposed on the third active pattern.

11. The OLED display of claim 10, wherein the node line is disposed on the same layer as the data line.

12. The OLED display of claim 10, further comprising:
    a first scan line disposed on the second active pattern and crossing the second and third active patterns, wherein the first scan line is electrically connected to the second and third gate electrodes; and
    a driving power source line disposed adjacent to the data line and crossing the first scan line, wherein the driving power source line is electrically connected to the first active pattern.

13. The OLED display of claim 12, further comprising a capacitor electrode electrically connected to the driving power source line and overlapping the first gate electrode in the depth dimension of the OLED display to form a capacitor along with the first gate electrode.

14. The OLED display of claim 13, wherein the capacitor electrode further includes an opening connected to the contact hole.

15. The OLED display of claim 12, wherein the TFTs further include a fourth TFT connected to the third active pattern and including i) a fourth active pattern electrically connected to the first gate electrode through the node line and ii) a fourth gate electrode disposed on the fourth active pattern, and
    wherein the OLED display further comprises:
        a second scan line disposed on the fourth active pattern and crossing the fourth active pattern, wherein the second scan line is electrically connected to the fourth gate electrode; and
        an initialization power source line electrically connected to the fourth active pattern.

16. The OLED display of claim 15, wherein the TFTs further include:
    a fifth TFT including i) a fifth active pattern connecting the first active pattern to the driving power source line and ii) a fifth gate electrode disposed on the fifth active pattern; and
    a sixth TFT including i) a sixth active pattern connecting the first active pattern to the OLED and ii) a sixth gate electrode disposed on the sixth active pattern, and
    wherein the OLED display further comprises a light emission control line disposed on the fifth and sixth active patterns and crossing the fifth and sixth active patterns, wherein the light emission control line is electrically connected to the fifth and sixth gate electrodes.

17. The OLED display of claim 16, wherein the TFTs further include a seventh TFT including i) a seventh active pattern electrically connected to the fourth active pattern and ii) a seventh gate electrode disposed on the seventh active pattern, and
wherein the OLED display further comprises a third scan line disposed on the seventh active pattern and crossing the seventh active pattern, wherein the third scan line is electrically connected to the seventh gate electrode.

18. An organic light-emitting diode (OLED) display, comprising:
a substrate including a display area displaying an image, wherein the display area includes first and second regions;
a plurality of OLEDs disposed on the display area and separated from one another; and
a plurality of pixel circuits disposed on the display area, the pixel circuits including a first pixel circuit in the first region and a second pixel circuit in the second region, wherein first and second contacts holes are respectively disposed in the first and second pixel circuits, wherein each pixel circuit includes i) a plurality of thin film transistors (TFTs) including first and second TFTs and electrically connected to the OLEDs and ii) a node line electrically connecting the first TFT to the second TFT through the first and second contact holes,
wherein the second contact hole is greater in area than the first contact hole.

19. An organic light-emitting diode (OLED) display, comprising:
a substrate including a display area displaying an image, wherein the display area includes first and second regions;
a plurality of OLEDs disposed on the display area and separated from one another; and
a plurality of pixel circuits disposed on the display area and including a first pixel circuit in the first region and a second pixel circuit in the second region, wherein each pixel circuit includes i) a plurality of TFTs including first and second TFTs and electrically connected to the OLEDs and ii) a node line electrically connecting the first TFT to the second TFT through one or more contact holes,
wherein the number of contact holes of the first pixel circuit is greater than the number of contact holes of the second pixel circuit.

20. An organic light-emitting diode (OLED) display, comprising:
a substrate including a display area displaying an image, wherein the display area includes first and second regions;
a plurality of OLEDs disposed on the display area and separated from one another; and
a plurality of pixel circuits formed in the display area and including a first pixel circuit in the first region and a second pixel circuit in the second region, wherein first and second contacts holes are respectively disposed in the first and second pixel circuits, wherein each pixel circuit includes i) a plurality of TFTs including first and second TFTs and electrically connected to the OLEDs and ii) a node line electrically connecting the first TFT to the second TFT through the first and second contact holes,
wherein the first contact hole overlaps an active pattern of one of the TFTs is greater in area than the second contact hole.

* * * * *